(12) United States Patent
Muljono

(10) Patent No.: US 6,636,069 B1
(45) Date of Patent: Oct. 21, 2003

(54) METHOD AND APPARATUS FOR COMPENSATED SLEW RATE CONTROL OF LINE TERMINATION

(75) Inventor: Harry Muljono, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/533,620

(22) Filed: Mar. 22, 2000

(51) Int. Cl.$^7$ .............................................. H03K 17/16
(52) U.S. Cl. .............................. 326/30; 326/86; 326/87
(58) Field of Search ............................ 326/30, 86, 87, 326/83

(56) References Cited

U.S. PATENT DOCUMENTS

| | | | |
|---|---|---|---|
| 4,992,677 A | 2/1991 | Ishibashi et al. ............. | 307/443 |
| 5,122,690 A | 6/1992 | Bianchi ....................... | 307/475 |
| 5,166,555 A | 11/1992 | Kano .......................... | 307/451 |
| 5,187,686 A | 2/1993 | Tran et al. ............. | 365/189.11 |
| 5,212,801 A | 5/1993 | Farmer ........................ | 395/800 |
| 5,331,220 A | 7/1994 | Pierce et al. ................ | 307/475 |
| 5,341,039 A * | 8/1994 | Fukumoto ................... | 307/443 |
| 5,602,494 A | 2/1997 | Sundstrom .................... | 326/39 |
| 5,731,711 A * | 3/1998 | Gabara ......................... | 326/30 |
| 5,786,709 A | 7/1998 | Kirsch et al. ................. | 326/27 |
| 5,789,937 A | 8/1998 | Cao et al. ..................... | 326/30 |
| 5,869,983 A | 2/1999 | Ilkbahar et al. ............... | 326/83 |
| 5,898,321 A | 4/1999 | Ilkbahar et al. ............... | 326/27 |
| 5,923,183 A | 7/1999 | Kim et al. .................... | 326/27 |
| 5,977,790 A | 11/1999 | Sanwo et al. ................. | 326/27 |
| 6,026,456 A * | 2/2000 | Ilkbahar ....................... | 710/101 |
| 6,031,385 A | 2/2000 | Ilkbahar ....................... | 324/763 |
| 6,054,881 A * | 4/2000 | Stoenner ...................... | 327/112 |
| 6,288,563 B1 | 9/2001 | Muljono et al. ............... | 326/27 |
| 6,347,350 B1 | 2/2002 | Muljono ....................... | 710/100 |
| 6,366,129 B1 | 4/2002 | Douglas, III et al. ......... | 326/86 |

* cited by examiner

Primary Examiner—Michael Tokar
Assistant Examiner—Anh Tran
(74) Attorney, Agent, or Firm—Blakely, Sokoloff, Taylor & Zafman LLP

(57) ABSTRACT

In one embodiment, a high speed bi-directional driver/receiver is provided. When a first component driving data onto a bi-directional bus switches to receiving data from the bus, a second component drives the last logic value received back onto the bus. The first component then disengages its driver circuit and engages a center-tapped line termination circuit, but in order to avoid glitches, the line termination is engaged at a controlled slew rate. The controlled slew rate is generated through a combination of variably sized transistors connected with a voltage source and a charge accumulation node. By controlling which transistors are turned on, the rate at which the node accumulates a charge can be adjusted. When the termination circuit is to be activated, the charge, which is accumulating at a controlled rate, is connected to the gate of the termination transistors, thereby controlling the change in impedance of the termination resistors to avoid voltage glitches on the transmission line. In one embodiment, slew rate control circuitry may be shared between a compensated driver control and a compensated termination control to provide compensated slew rate control to both the drivers and the line termination.

22 Claims, 22 Drawing Sheets

METHOD AND APPARATUS FOR COMPENSATED SLEW RATE CONTROL OF LINE TERMINATION

FIELD OF THE INVENTION

The present disclosure pertains to the field of signal transfer between components. More particularly, the present disclosure pertains to slew rate control of line termination devices used on bi-directional transmission lines.

BACKGROUND OF THE INVENTION

Termination techniques are employed to improve the signal quality of communications between components by reducing signal degradation due to transmission line artifacts such as reflection or ringing. One termination technique is known as source termination.

Source termination is illustrated in FIG. 1a. In source termination, a transmission line, 113, is terminated through use of a resistance, 115, at the driver or source end, 110, of the transmission line. Typically this resistance is provided by the active device in the driver. When a signal is transmitted by a driver, 112, it propagates along the transmission line until it reaches a receiver, 114. A reflection occurs at the receiver end of the transmission line, 111, due to an impedance discontinuity and the reflected signal propagates back along the transmission line in a direction toward the driver. When the reflected signal reaches the driver, it is absorbed by the source terminator, 115.

One problem with source termination, is that it limits the frequency at which signals can be transmitted, since a driver must wait for previous signal reflections to propagate before transmitting new signals. If a new signal is transmitted before the reflections die down, signal degradation due to jitter may result.

An alternative technique is called center-tapped termination (CTT). The CTT technique is illustrated in FIGS. 1b and 1c. CTT is used to absorb or avoid reflections at the receiver end of the transmission line, 121, by providing two equal resistances: one, 126, tied to a voltage source VCC and the other, 127, tied to a ground voltage source. Thus the receiver end of the transmission line is biased to a central voltage of VCC/2.

Since a component, 130 or 131, on a bi-directional transmission line, 133, may act as a receiver at one time and as a driver at another time, the CTT device 135 may be turned off when the component is acting as a driver 132, and the CCT device 136 may be turned on when the component is acting as a receiver 134.

One problem with this technique is that during the time when receiving devices are turning on their termination CTT devices and a driver is turning off its CTT devices a glitch may occur. A graph of the voltage levels on a transmission line as seen by a receiver is shown in FIG. 2. A glitch, 202, results from a new CTT device turning on as the old driver turns off. When the driver turns off the line may tend to float to the bias voltage level of VCC/2. One danger is that receivers on the transmission line may mistake the glitch, 202, for a new valid signal level, 204, transmitted by the new driver.

Another technique used to improve signal quality is known as slew rate control. An example of one prior method, discussed in U.S. Pat. No. 5,977,790, is shown in FIG. 3. In the circuit shown, a signal, SEL, is used to select between two driver circuits. One of the driver circuits employs devices M1 and M2 to drive the voltage accumulated at PAD to the same logic level as the value received at the input, DATA. The other driver circuit employs devices M5 and M6 to drive the desired voltage accumulated at PAD, but through a resistance, RT, thereby producing a selected slew rate, which is different than that of the first driver circuit.

BRIEF DESCRIPTION OF THE DRAWINGS

The present invention is illustrated by way of example and not limitation in the figures of the accompanying drawings.

DETAILED DESCRIPTION

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

A process, voltage and temperature (PVT) compensated slew rate control is disclosed for turning on and turning off line terminators. Through its use, consistent performance targets may be realized across generational process differences and various operating conditions. In addition, sharing of PVT compensated slew rate generation circuitry between a driver control generation block and a termination control generation block is disclosed. Benefits that may result from use of these techniques include reduction of the circuit area required, improvement of signal quality and synchronization of slew rates for drivers and terminators.

Figure 1A:
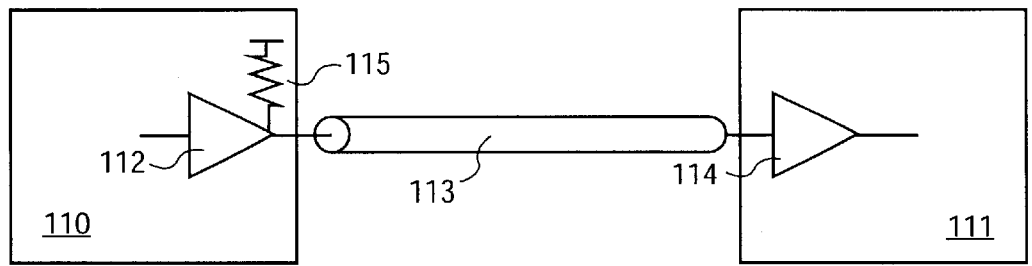
FIG. 1a shows a source termination technique.
Figure 1B:
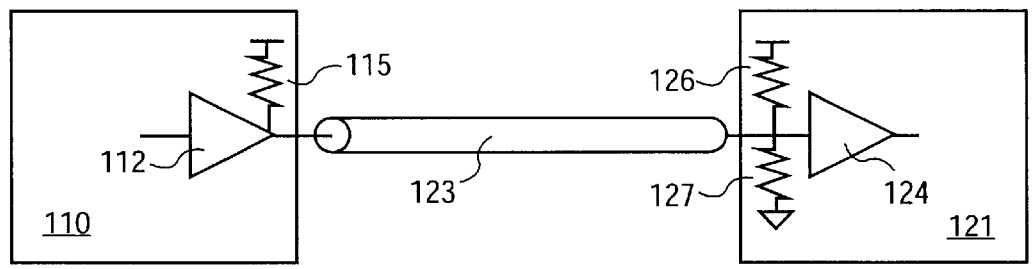
FIG. 1b shows a center-tapped termination technique.
Figure 1C:
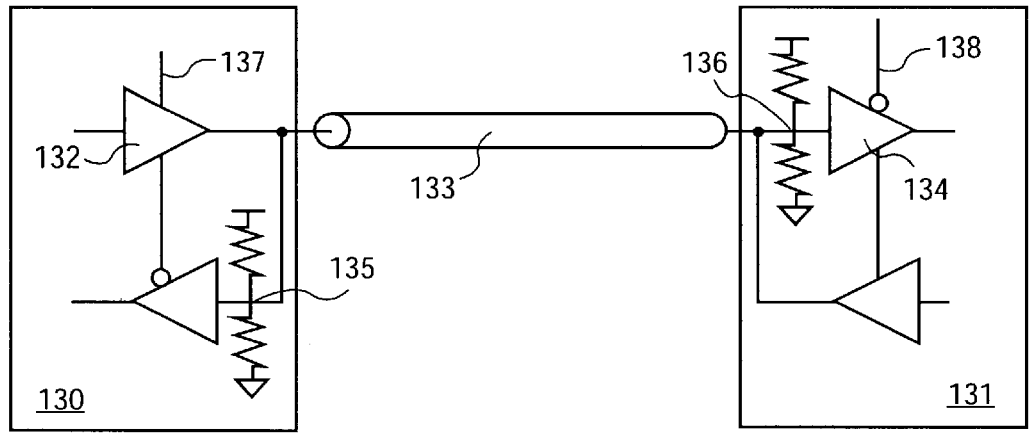
FIG. 1c shows center-tapped termination on a bi-directional transmission line.
Figure 2:
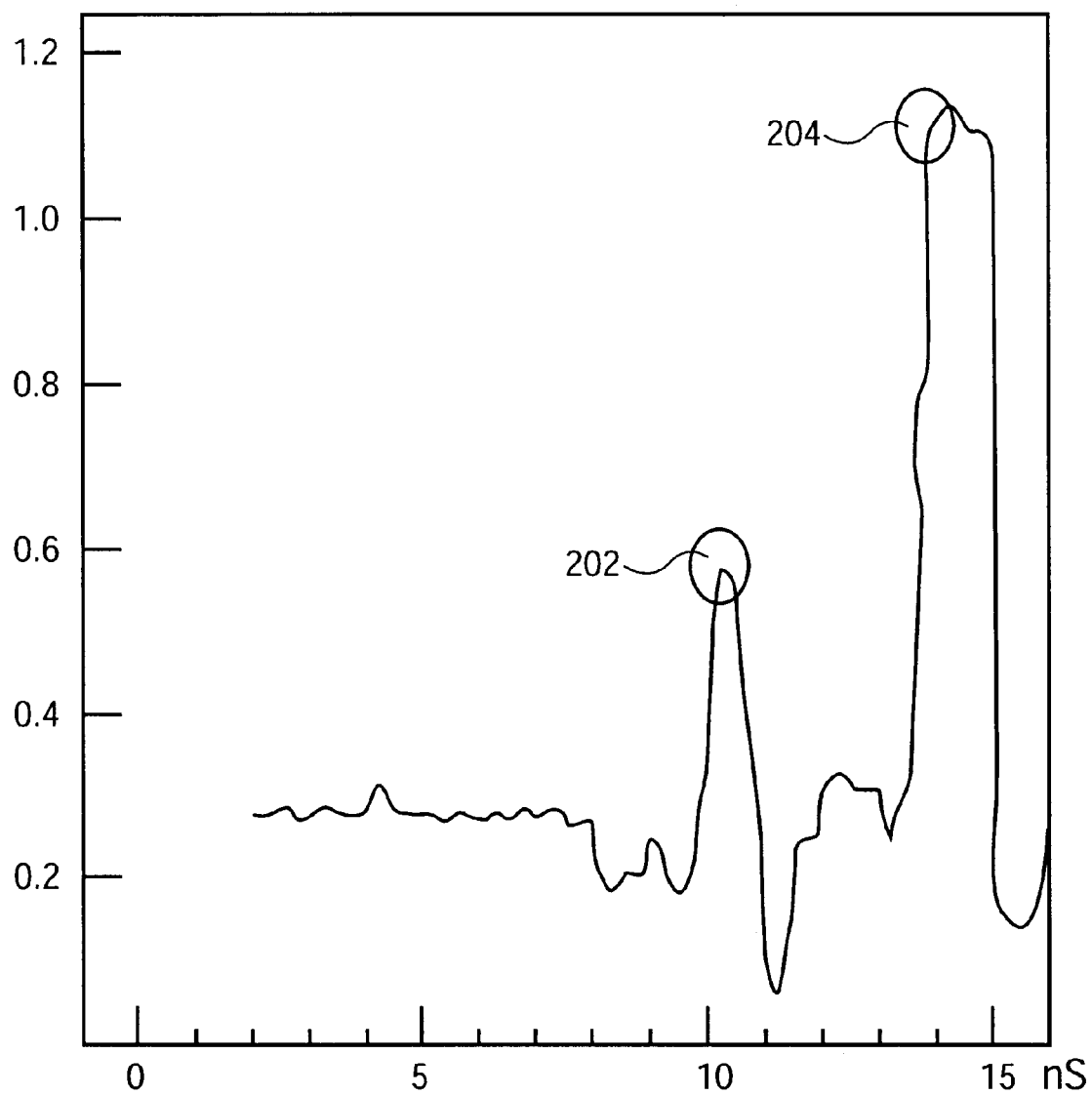
FIG. 2 shows a graph of the voltage level seen on a transmission line as the direction of transmission switches, producing a voltage glitch.
Figure 3:
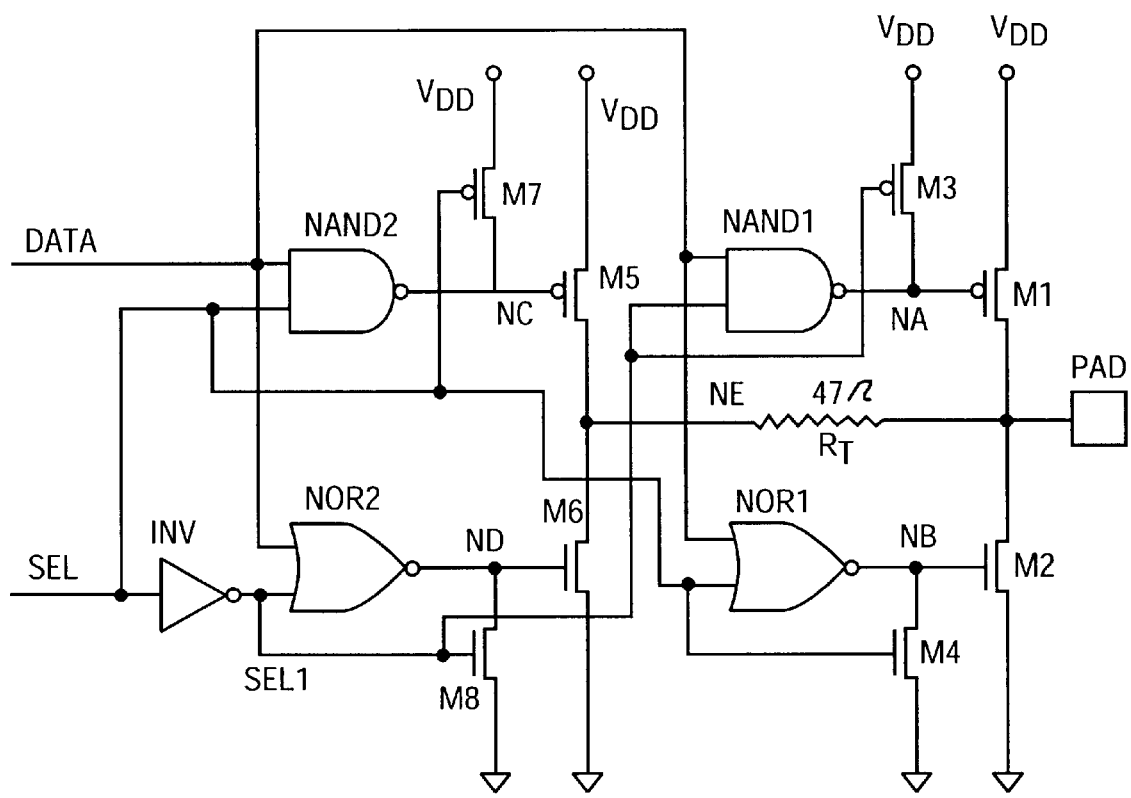
FIG. 3 shows a prior art driver with slew rate selection.
Figure 4:
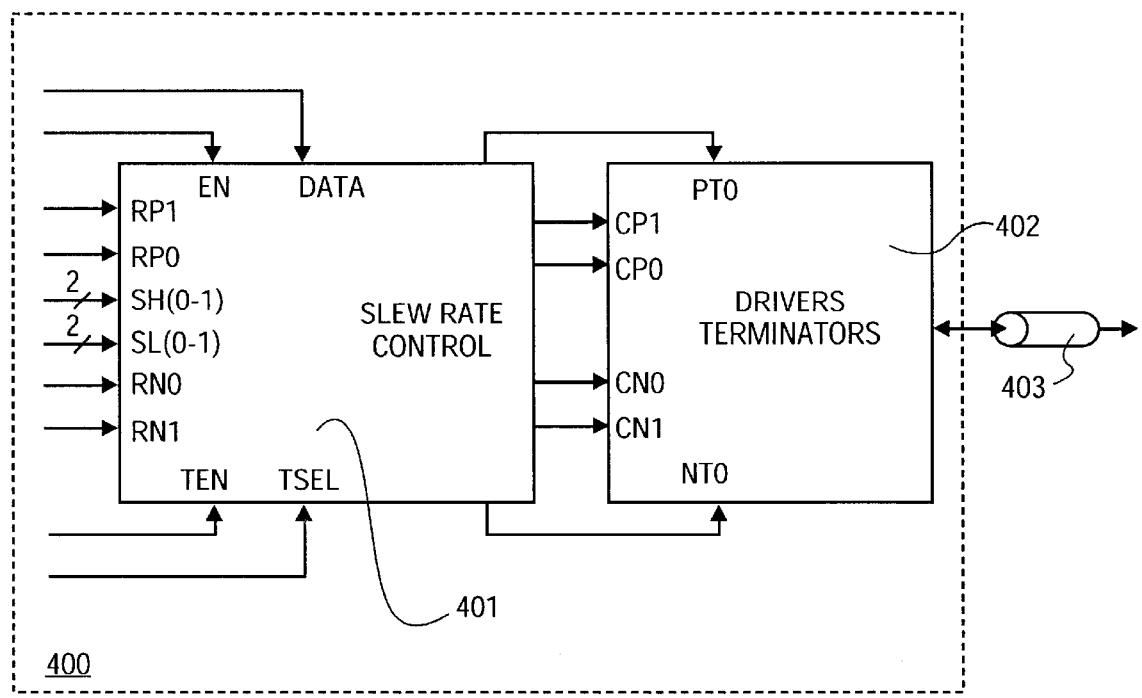
FIG. 4 shows one embodiment of a bi-directional driver/receiver device with compensated slew rate control circuitry.

FIG. 4 depicts portions of an embodiment of a bi-directional driver/receiver device 400 with compensated slew rate control circuitry 401. The control signals generated in control generation block 401 are used to selectively engage and disengage drivers and terminators 402 at PVT compensated slew rates.

The drivers and terminators 402 are connected with a transmission line 403 to transmit signals to or receive signals from other devices (not shown). These other devices may have similar or dissimilar process or thermal characteristics. Transmission line 403 may represent a wire or a conductive trace in a printed circuit board, a multi-chip module, a layer of an integrated circuit, a bus, a package or some other device. The PVT slew rate compensated drivers and terminators may be part of a central processing unit, a cache memory subsystem, a memory controller, a graphics subsystem, or some other device.

Slew rate control block 401 receives a driver enable signal, EN; a data signal, DATA; a termination enable signal, TEN; resistance adjustment or impedance adjustment selectors for controlling the number of p-type transistors, RP0 and RP1, or n-type transistors, RN0 and RN1, activated in the driver; and a selector, TSEL, to adjust the termination impedance relative to the driver. The slew rate control block also receives slew adjustment selectors, SH[0-1] and SL[0-1]. From these inputs, slew rate control block 401 produces slew rate controlled compensation inputs for the drivers CP0, CP1, CN0, and CN1, and for the terminators, PT and NT, in block 402. In response to these slew rate controlled compensation inputs, driver/terminator block 402 engages or disengages the selected drivers or terminators to interact with transmission line 403.

Figure 5:
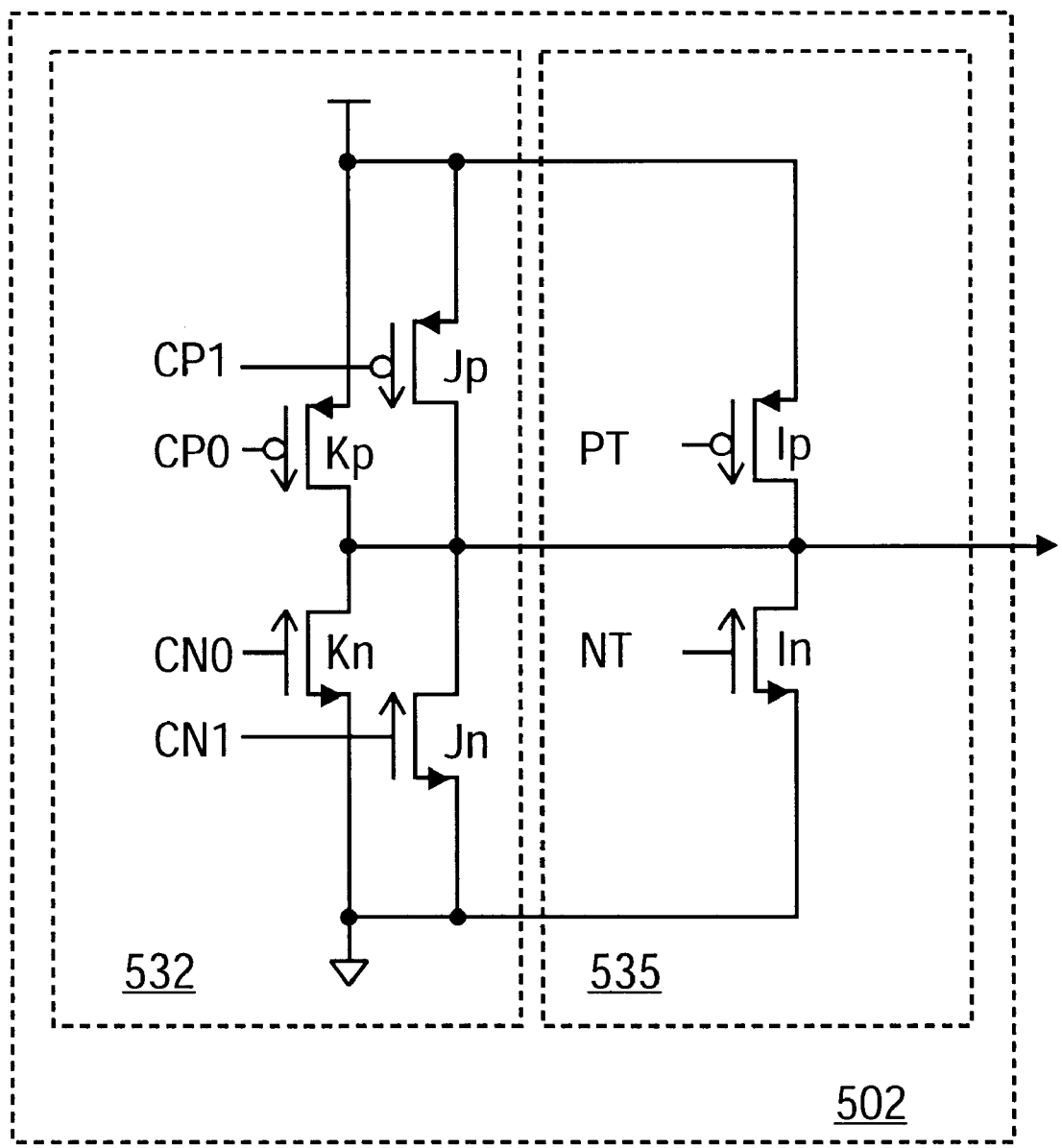
FIG. 5 shows one embodiment of drivers and terminators for use in a bi-directional driver/receiver device.

FIG. 5 illustrated one embodiment of a circuit implementing drivers 532 and terminators 535 for use in a bi-directional driver/receiver device. Driver/terminator block 502 receives slew rate controlled compensation inputs CP0 and CP1 to tune the impedance and control the rate at which the p-type transistors of the driver are engaged or disengaged. Likewise, slew rate controlled compensation inputs CN0 and CN1, tune the impedance and control the rate at which the n-type transistors of the driver are engaged or disengaged. The inputs PT and NT control the rate at which the terminators are engaged or disengaged. Transistor sizes, Kp, Jp and Ip for the p-type devices, and Kn, Jn, and In for the n-type devices may be selected empirically to provide desired combinations of impedance and speed.

Typically, as the drivers are engaged, the terminators are disengaged. One embodiment provides for independent control of driver and terminator slew rates during engagement or disengagement or both. One possible set of circuits, which can produce these slew rate controlled compensation inputs is shown in FIGS. 6a and 6b.

Figure 6A:
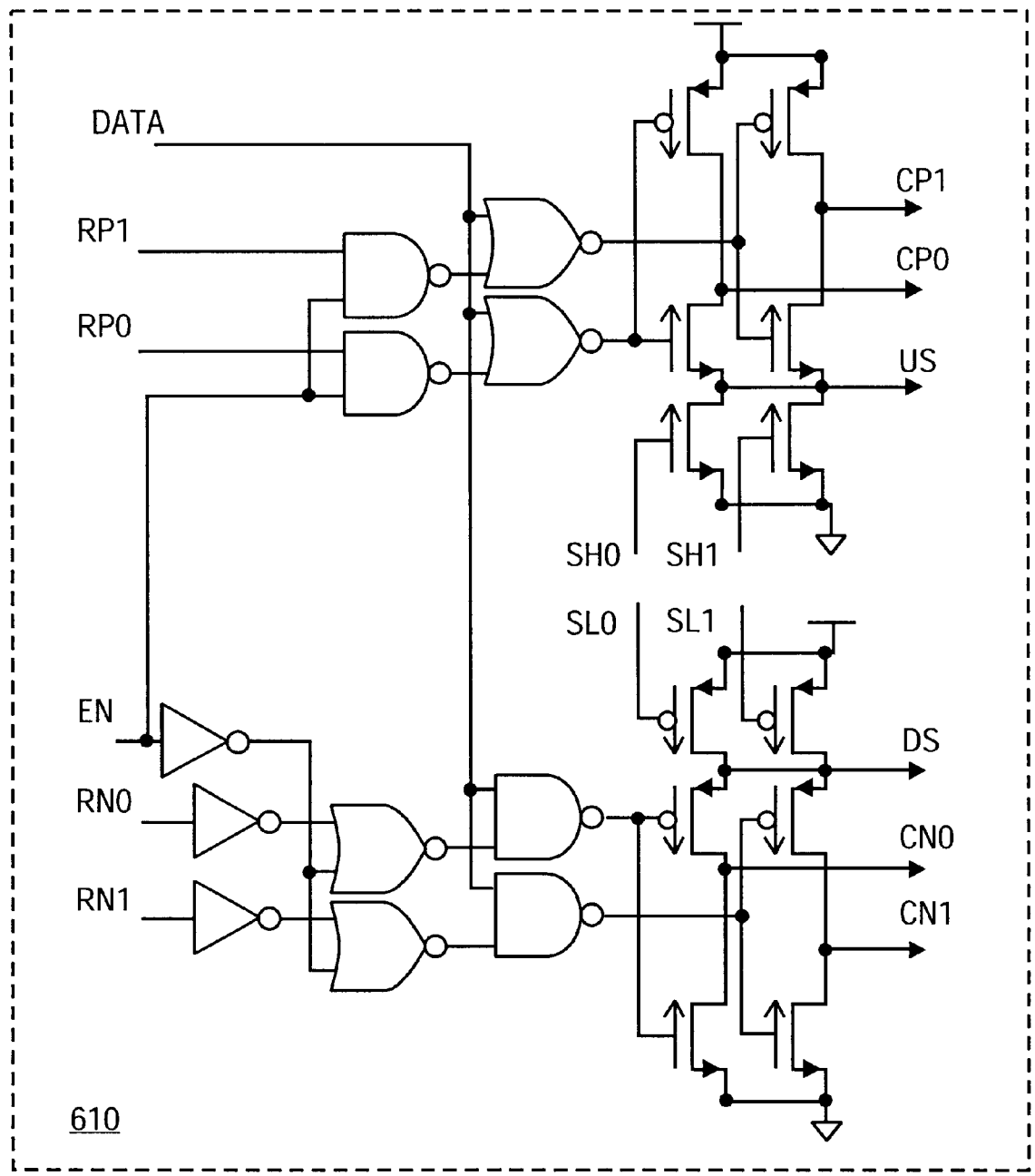
FIG. 6a shows one embodiment of a compensated slew rate control circuit for controlling driver circuitry in a bi-directional driver/receiver device.

FIG. 6a illustrates a compensated slew rate control circuit 610 to receive data and enable signals, DATA and EN, for turning on compensated driver circuit 532 to transmit data on a transmission line. Compensated slew rate control circuit 610 also receives resistance adjustment selectors for controlling the number and sizes of p-type transistors, RP0 and RP1, or n-type transistors, RN0 and RN1, made active in the driver.

Compensated slew rate control circuit 610 also receives high active slew adjustment selectors, SH[0-1], and low active slew adjustment selectors, SL[0-1], to adjust the rate at which driver transistors will be activated. When the p-type drivers are activated, a charge accumulates at up-slew node, US, due to the gate capacitance of the driver and according to which of the n-type devices are selected by SH0 and SH1. Accordingly, the speed at which node, US, is pulled down through the resistance selected by SH0 and SH1 determines the rate at which the p-type transistors in the driver are activated. Similarly, the rate at which a charge accumulates at down-slew node, DS, according to the resistance selected by low active slew adjustment selectors SL0 and SL1, determines the rate at which the n-type transistors in the driver are activated. Thus, from these inputs, slew rate control block 401 produces slew rate controlled compensation inputs CP0, CP1, CN0, and CN1.

Figure 6B:
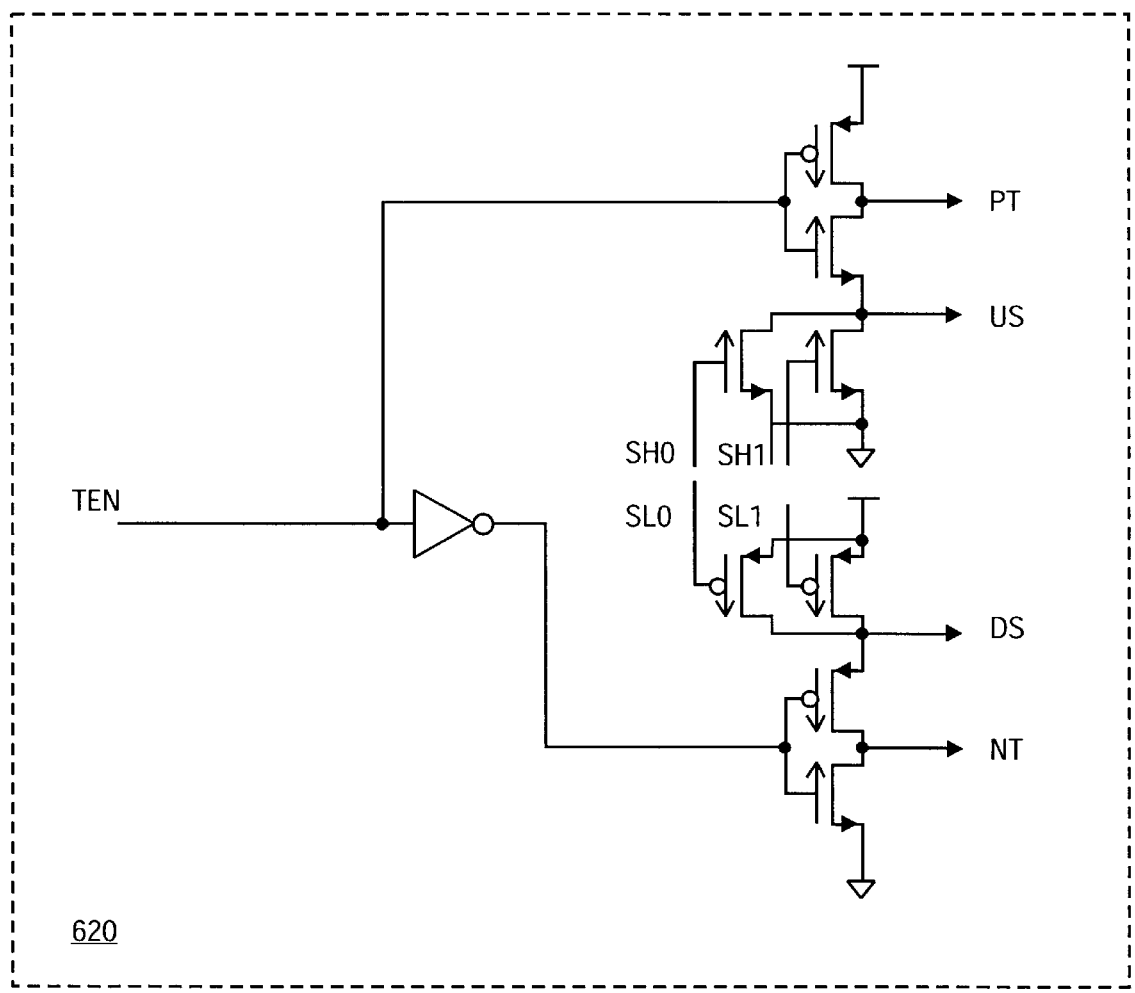
FIG. 6b shows one embodiment of a compensated slew rate control circuit for controlling terminator circuitry in a bi-directional driver/receiver device.

FIG. 6b discloses a slew rate control circuit 620 for controlling terminator circuitry 535 in a bi-directional driver/receiver device. According to the resistance selected by SH0 and SH1, the voltage level at node, US, is pulled down at a controlled rate and hence the p-type termination transistor controlled by control signal, PT, is activated at a controlled rate. Likewise, the voltage level at node, DS, is pulled up at a rate determined by a resistance selected by SL0 and SL1 and hence the n-type termination transistor controlled by control signal, NT, is activated at a controlled rate. Of course it should be clear to one skilled in the art of circuit design that the slew rates of deactivation could be controlled is a similar manner. It should also be clear that the circuit shown could be modified in implementation details without departing from the subject matter claimed by the applicant.

Figure 6C:
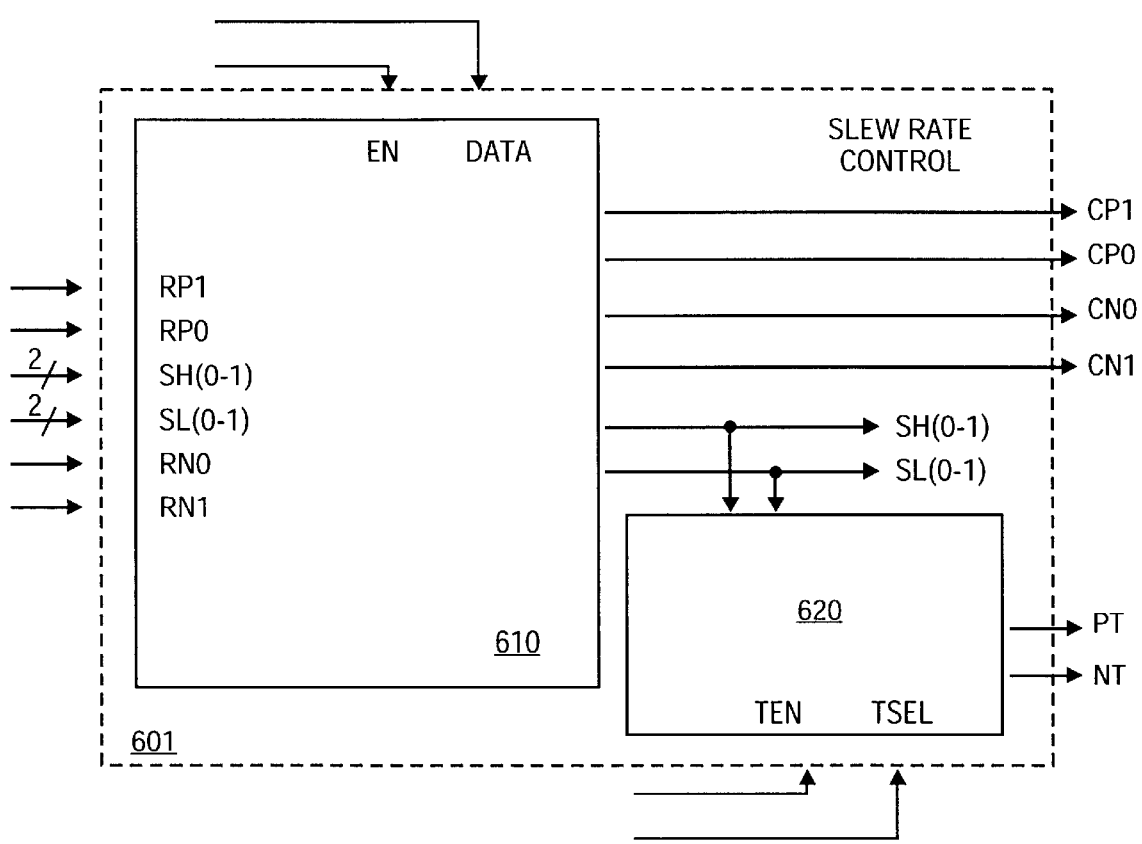
FIG. 6c shows one embodiment of a compensated slew rate control circuit for controlling driver and terminator circuitry in a bi-directional driver/receiver device using the circuits disclosed in FIGS. 6a and 6b.

FIG. 6c shows one possible embodiment of a compensated slew rate control circuit 601 for controlling driver and terminator circuitry through combining the compensated slew rate control circuit 610 for controlling driver circuitry with a slew rate control circuit 620 for controlling terminator circuitry.

Figure 7:
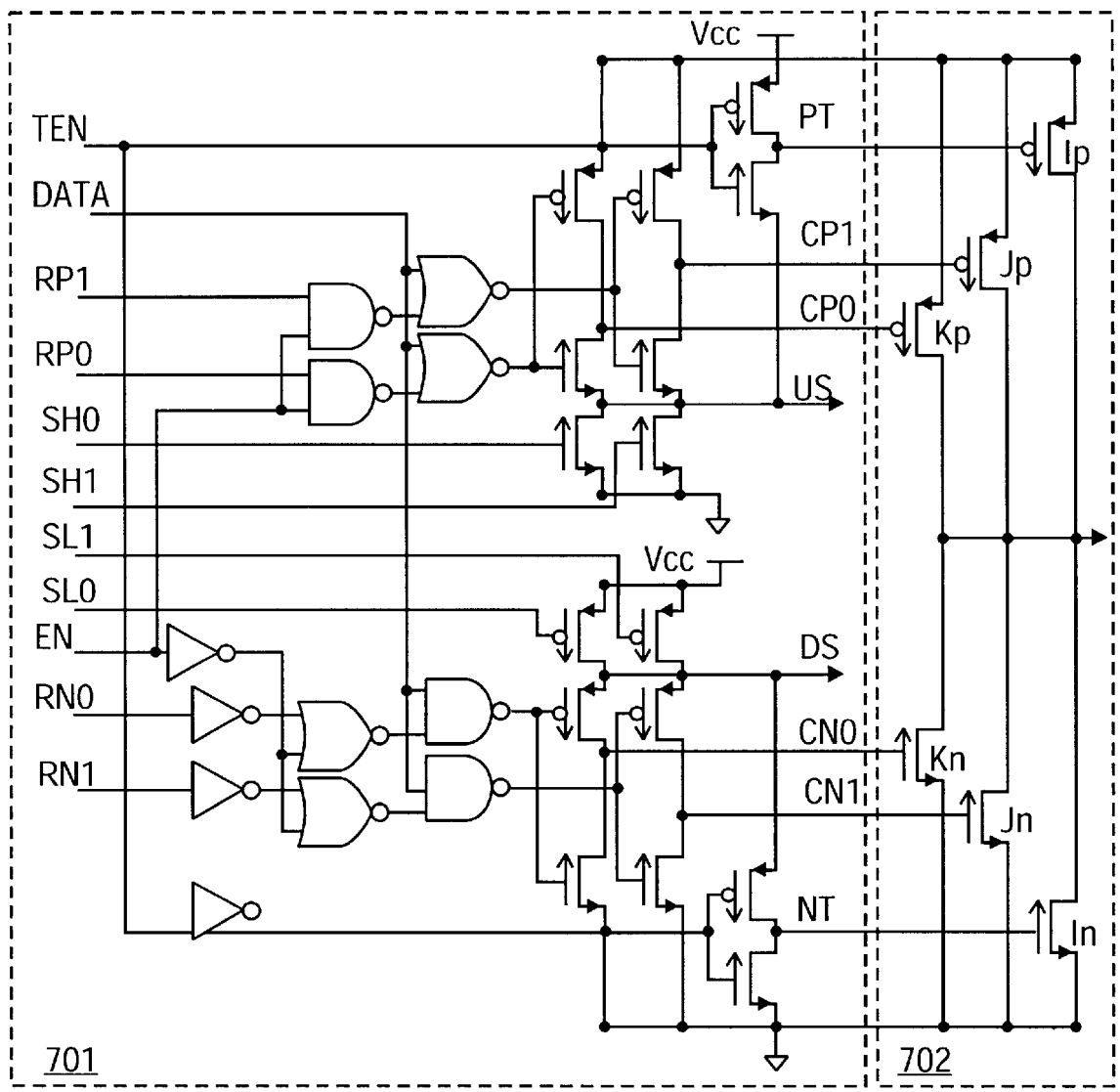
FIG. 7 shows one detailed embodiment of a bi-directional driver/receiver device with some slew rate control circuitry reused for both drivers and terminators.

FIG. 7 discloses another detailed embodiment of a bi-directional driver/receiver device with compensated slew rate control circuitry for both drivers and terminators. Compensated slew rate control circuit 701 makes use of the same slew rate control circuitry for both the driver controls, CP0, CP1, CN0 and CN1, and the terminator controls, PT and NT, to activate the drivers and terminators of block 702 at controlled rates.

Figure 8:
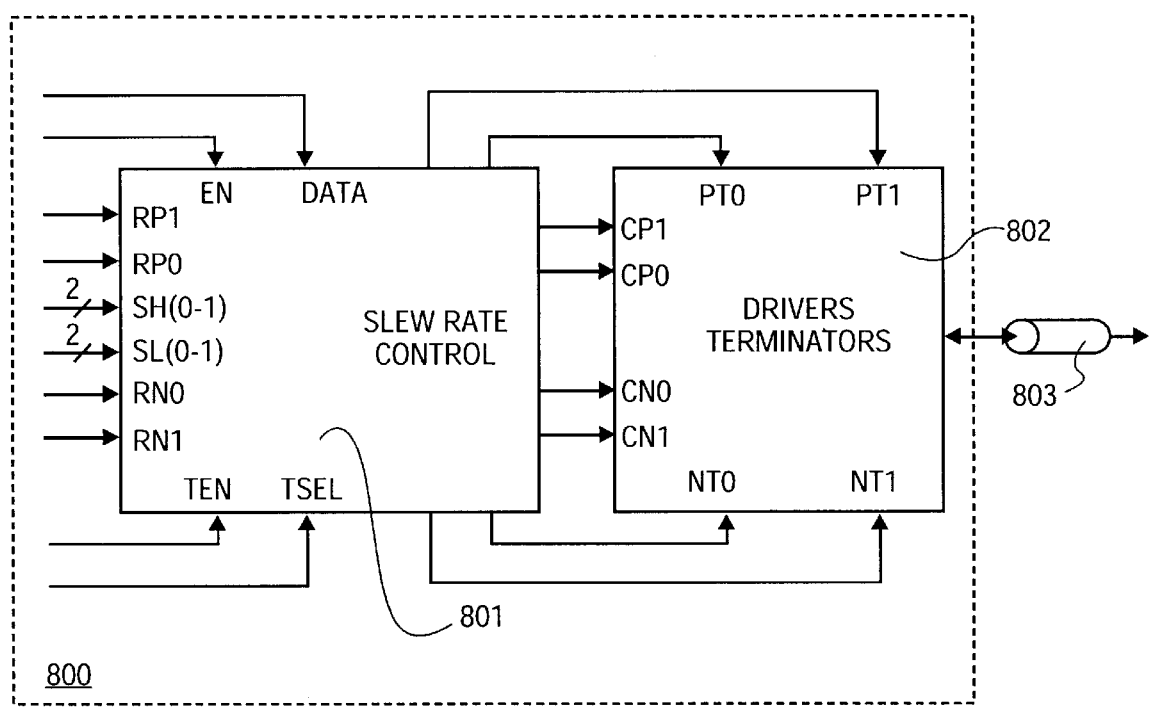
FIG. 8 shows another embodiment of a bi-directional driver/receiver device with compensated slew rate control circuitry.

FIG. 8 illustrates another embodiment of a bi-directional driver/receiver device 800 with compensated slew rate control circuitry 801 for controlling compensated drivers and compensated terminators 802 connected with transmission line 803.

Figure 9:
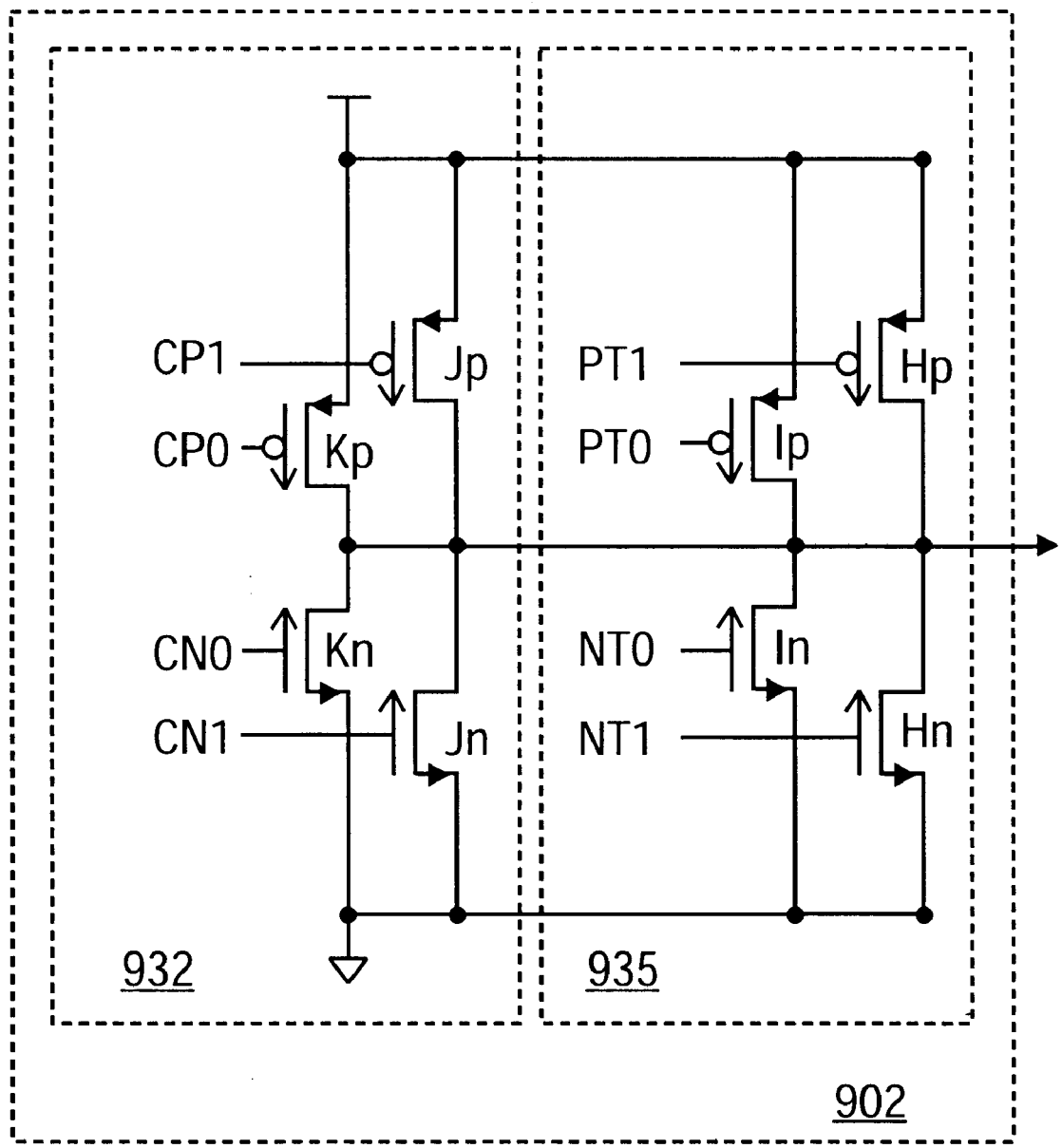
FIG. 9 shows another embodiment of drivers and terminators for use in a bi-directional driver/receiver device.

FIG. 9 details one possible embodiment of drivers 932 and terminators 935 for use in a bi-directional driver/receiver device such as the one shown in FIG. 8. In block 902, p-type transistor sizes, Kp, Jp, Ip and Hp, and the n-type transistor sizes, Kn, Jn, In, and Hn, may be selected to provide desirable impedance and speed combinations for various processes, and operating conditions. Impedance of driver outputs and terminators can be controlled independently through selection of compensation control signals, CP0, CP1, CN0 and CN1, and PT0, PT1, NT0 and NT1 respectively.

Figure 10:
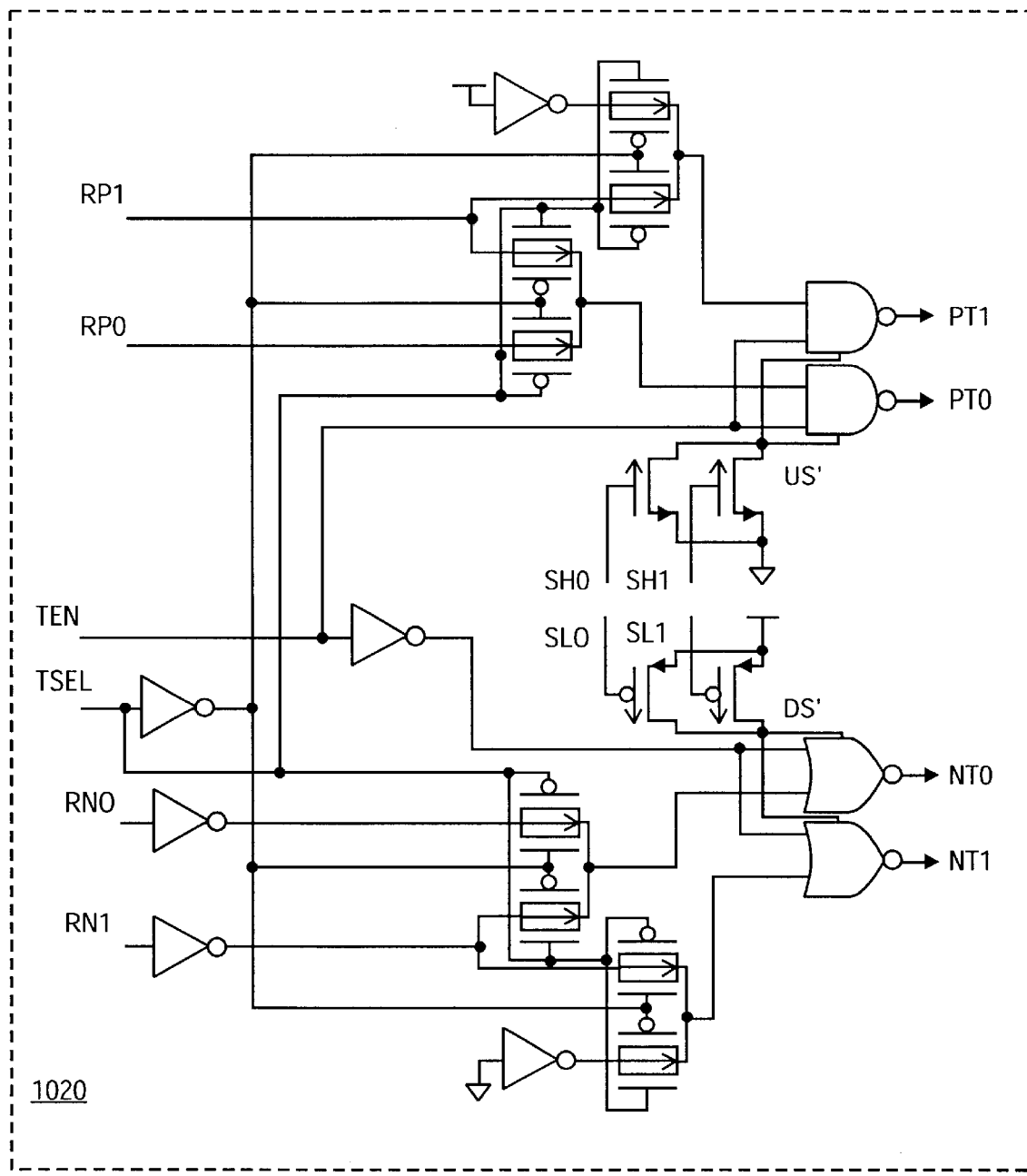
FIG. 10 shows one embodiment of a compensated slew rate control circuit for controlling terminator circuitry in a bi-directional driver/receiver device.

FIG. 10 details one possible embodiment of a compensated slew rate control circuit 1020 for controlling terminator circuitry 935 in a bi-directional driver/receiver device. The compensation control circuitry of block 1020 receives termination enable signal, TEN, for turning on compensated terminator circuit 935. Compensated slew rate control circuit 1020 also receives resistance adjustment selectors for controlling the number and sizes of p-type transistors, RP0 and RP1, or n-type transistors, RN0 and RN1, that are made active. The termination select signal, TSEL, permits resistance adjustment selectors to be used differently than in the driver compensation circuitry 610 by effectively shifting the signals by one bit.

Compensated slew rate control circuit 1020 also receives high active slew adjustment selectors, SH[0-1], and low active slew adjustment selectors, SL[0-1], to adjust the rate at which terminator transistors will be activated. Again, the speed at which node, US', is pulled down through the resistance selected by SH0 and SH1 determines the rate at which the p-type transistors in termination circuitry 935 are activated. Similarly, the rate at which a charge accumulates at down-slew node, DS', according to the resistance selected by low active slew adjustment selectors SL0 and SL1, determines the rate at which the n-type transistors in termination circuitry 935 are activated. Thus, from these inputs, slew rate control block 801 produces slew rate controlled compensation inputs PT0, PT1, NT0, and NT1.

Figure 11:
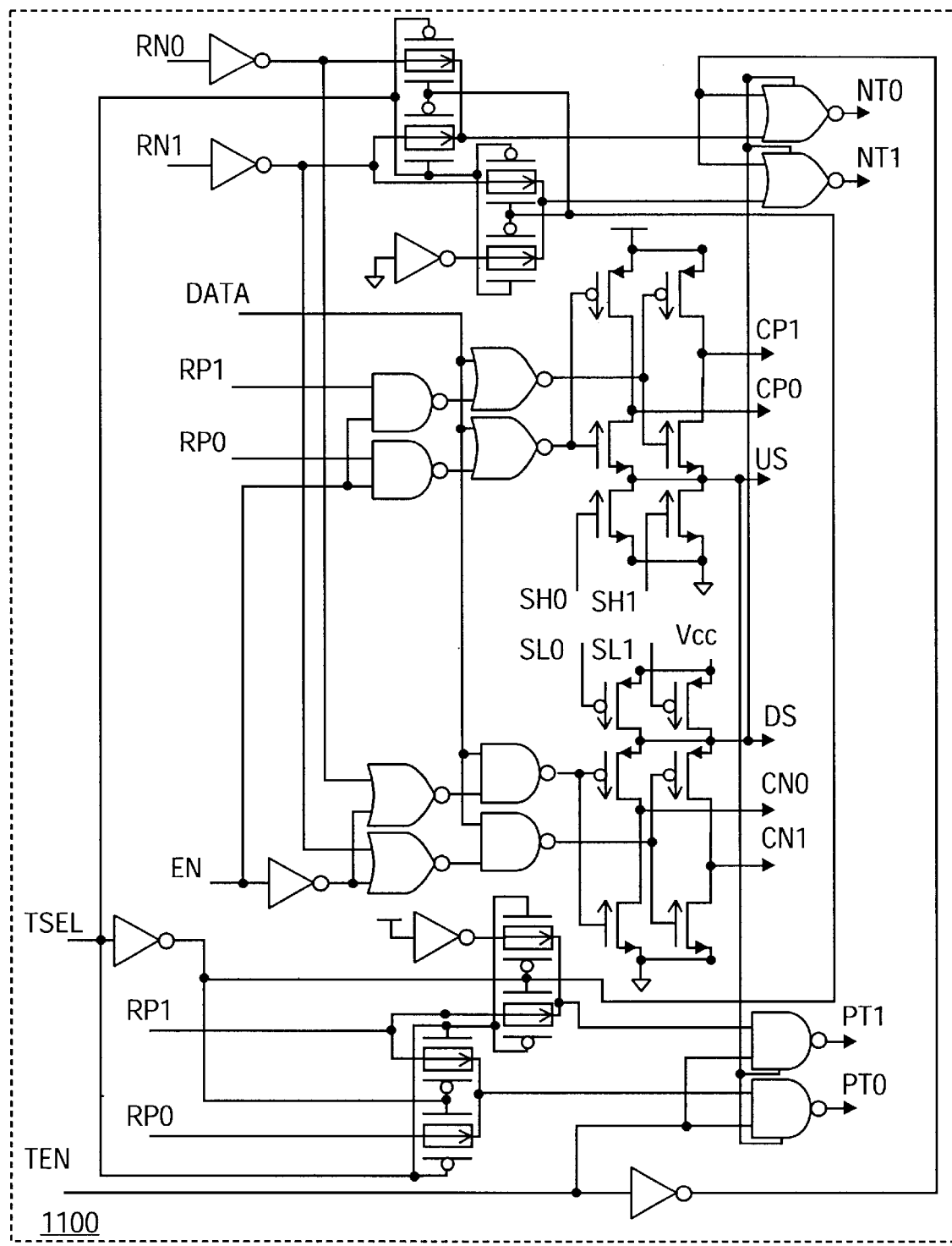
FIG. 11 shows another embodiment of a compensated slew rate control circuit for both drivers and terminators in a bi-directional driver/receiver device with some reuse of slew rate control circuitry.

FIG. 11 details another embodiment of a compensated slew rate control circuit 1101 for both drivers and terminators in the bi-directional driver/receiver device of FIG. 8 with some reuse of slew rate control circuitry to control the rates at which drivers 932 and terminators 935 are activated. Of course it would be clear to one skilled in the art, that the deactivation rates of either or both sets of devices could be controlled in a similar manner. It would also be clear that the functionality implemented herein with NAND gates and NOR gates could be implemented in a variety of ways—pass gates for example. These and other possible modifications could be made by those skilled in the art without departing from the subject matter claimed by the applicant as the invention.

Figure 12:
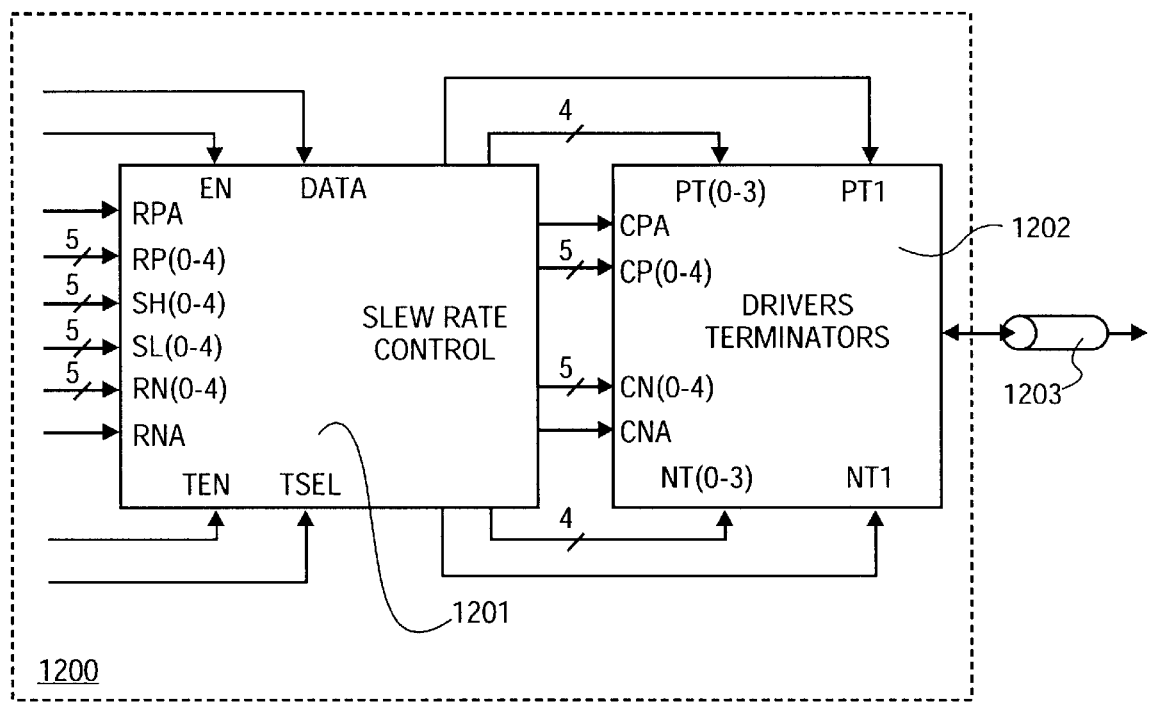
FIG. 12 shows another embodiment of a bi-directional driver/receiver device with compensated slew rate control circuitry.

FIG. 12 shows yet another embodiment of a bi-directional driver/receiver device 1200 with compensated slew rate control circuitry 1201 to control drivers and terminators 1202 connected with transmission line 1203.

Figure 13:
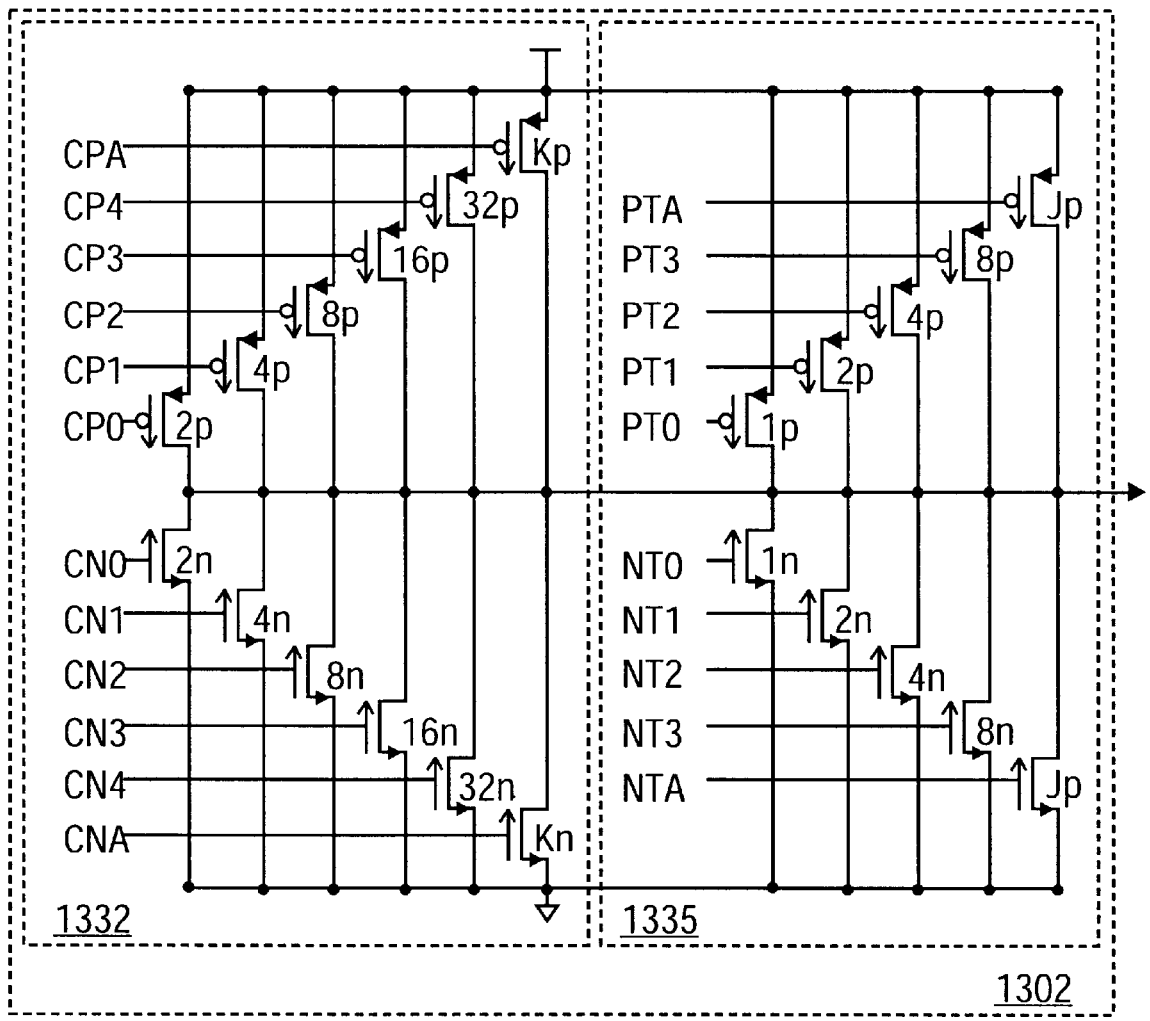
FIG. 13 shows another embodiment of drivers and terminators for use in a bi-directional driver/receiver device.

FIG. 13 illustrates details of the drivers and terminators, which are suitable for use in bi-directional driver/receiver device of FIG. 12. The sizes, Kp and Kn, of default driver transistors may be determined empirically for suitability of use with the fastest anticipated process, temperature and voltage characteristics. Similarly, the sizes, Jp and Jn, of default terminator transistors may be empirically determined by the fastest anticipated process and operating conditions. The other transistor sizes may be binary-weighted to allow $2^n$ total impedance combinations to be selected using n selection control signals. Therefore, termination circuitry 1335 provides for $2^4$ or 16 impedance selections and driver circuitry 1332 provides for $2^5$ or 32 impedance selections. The default devices, controlled by CPA and CNA for the drivers and PTA and NTA for the terminators, represent the highest active impedance selection and will always be activated when the corresponding p-type or n-type transistors are activated.

Figure 14A:
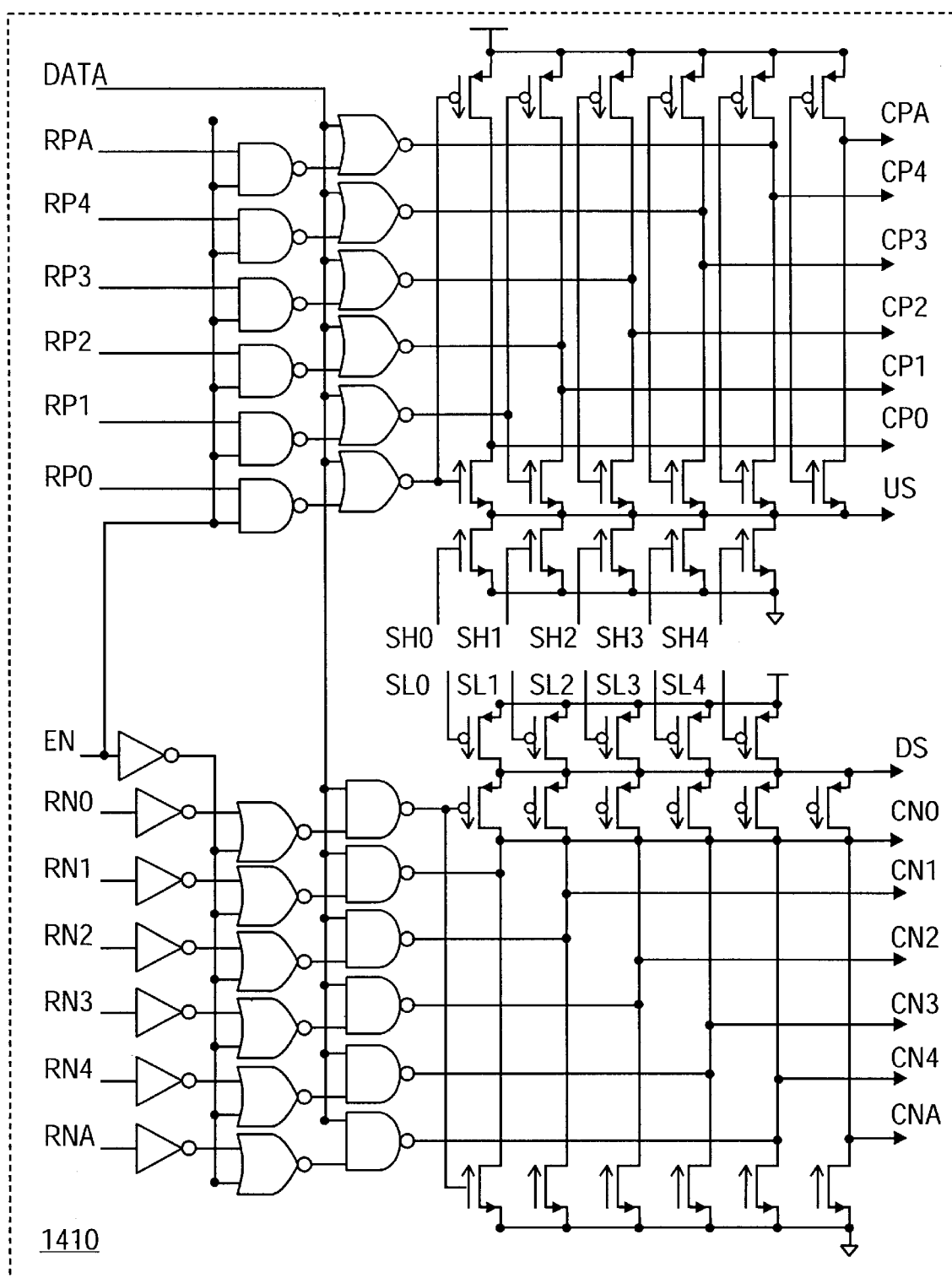
FIG. 14a shows another embodiment of a compensated slew rate control circuit for controlling driver circuitry in a bi-directional driver/receiver device.

FIG. 14a shows one embodiment of a compensated slew rate control circuit 1410 for controlling driver circuitry 1332 in the bi-directional driver/receiver device of FIG. 12.

Figure 14B:
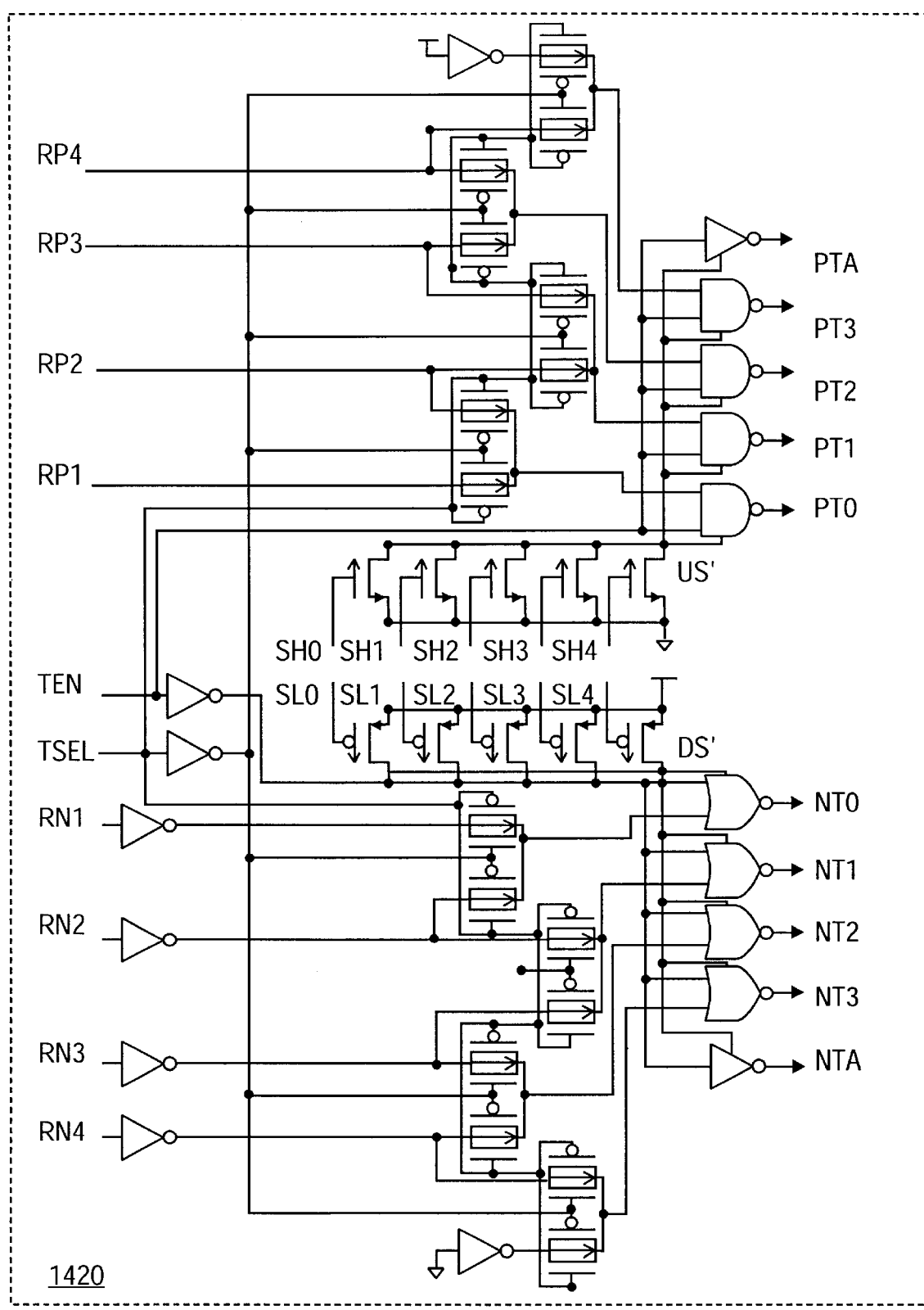
FIG. 14b shows another embodiment of a compensated slew rate control circuit for controlling terminator circuitry in a bi-directional driver/receiver device.

FIG. 14b shows one embodiment of a compensated slew rate control circuit 1420 for controlling terminator circuitry 1335 in the bi-directional driver/receiver device of FIG. 12. Again, compensated slew rate control circuit 1420 provides for shifting of resistance adjustment selectors by one bit so to use combinations differently in termination compensation circuitry 1420 than in driver compensation circuitry 1410. The speed at which node, US', is pulled down through the resistance selected by SH[0-4] determines the rate at which the p-type transistors in termination circuitry 1335 are activated. Similarly, the rate at which a charge accumulates at down-slew node, DS', according to the resistance selected by low active slew adjustment selectors SL[0-4], determines the rate at which the n-type transistors in termination circuitry 1335 are activated. Thus, from these inputs, slew rate control circuitry 1420 produces slew rate controlled compensation inputs PT[0-3], NT[0-3], PTA and NTA.

Figure 14C:
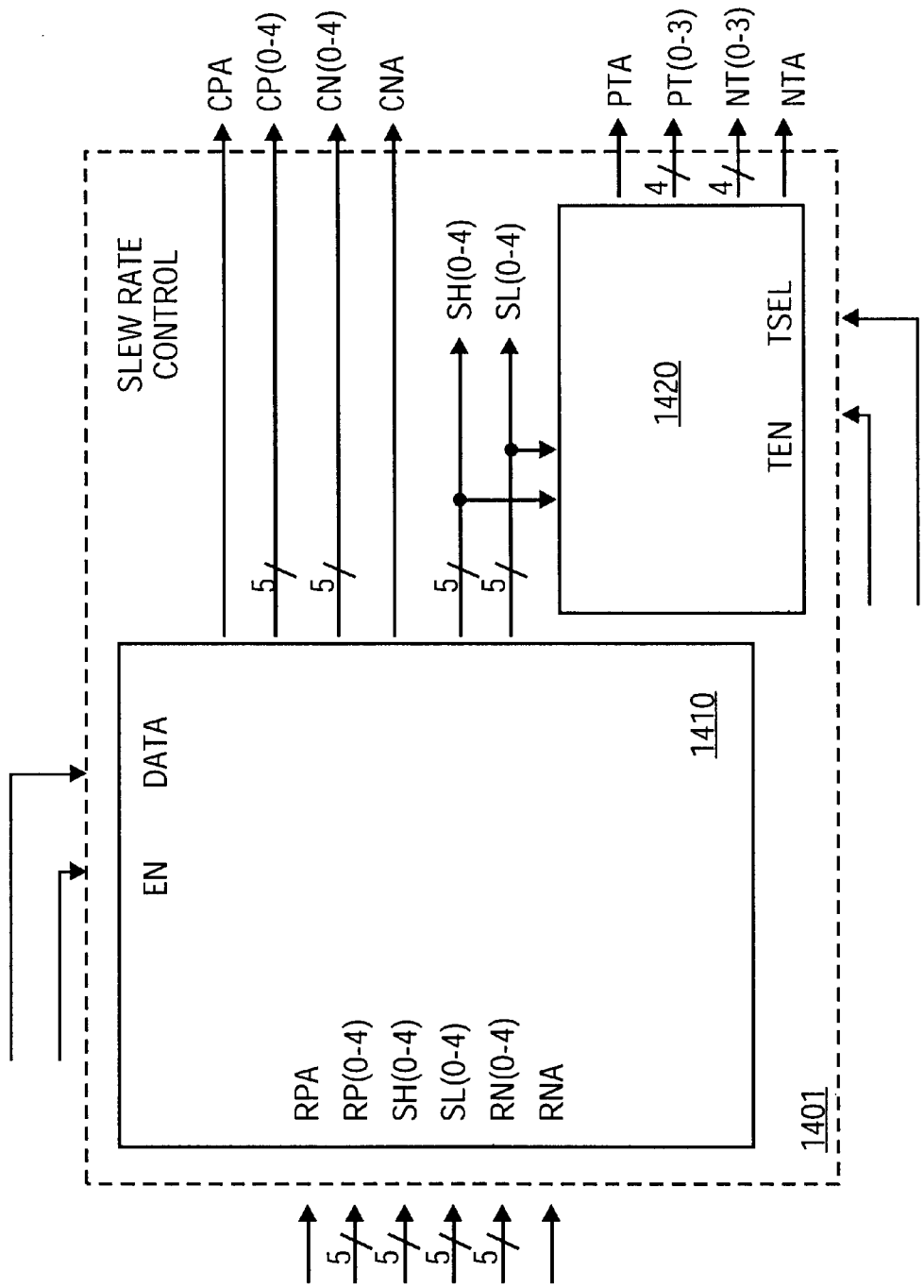
FIG. 14c shows a compensated slew rate control circuit including driver compensated slew rate control, 1410, and terminator compensated slew rate control, 1420, for use in a bi-directional driver/receiver device without reuse of slew rate control circuitry.

FIG. 14c diagrams a compensated slew rate control circuit 1401 comprising driver compensated slew rate control 1410 and terminator compensated slew rate control 1420 circuitry in a bi-directional driver/receiver device without reuse of compensated slew rate circuitry.

Figure 15A:
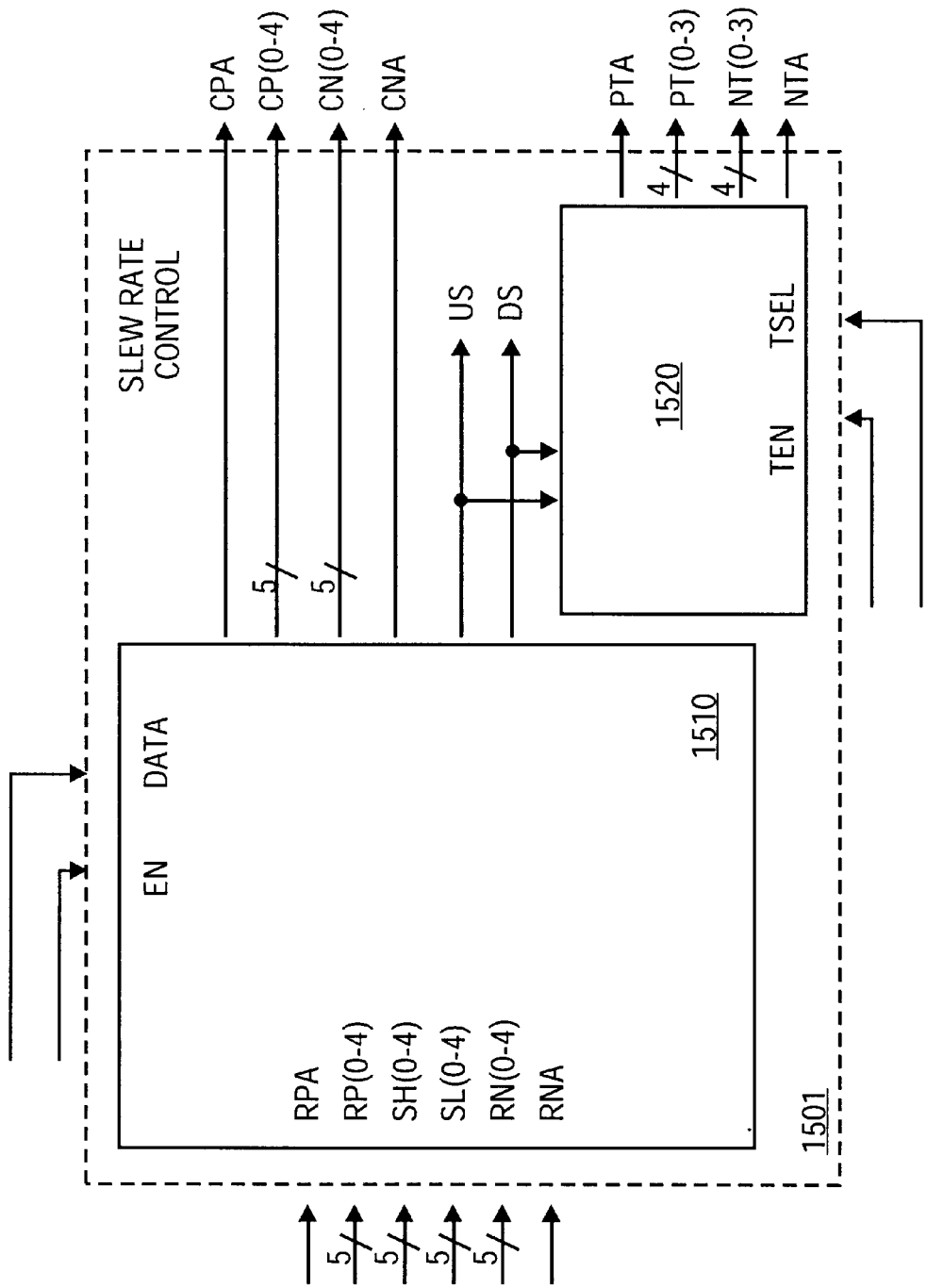
FIG. 15a shows an alternative compensated slew rate control circuit including driver compensated slew rate control, 1410, and terminator compensated slew rate control, 1520, for use in a bi-directional driver/receiver device, which allows for some reuse of slew rate control circuitry.

FIG. 15a shows an alternative compensated slew rate control circuit 1501 comprising driver compensated slew rate control 1410 and terminator compensated slew rate control 1520 in a bi-directional driver/receiver device, the current embodiment providing for some reuse of compensated slew rate circuitry.

Figure 15B:
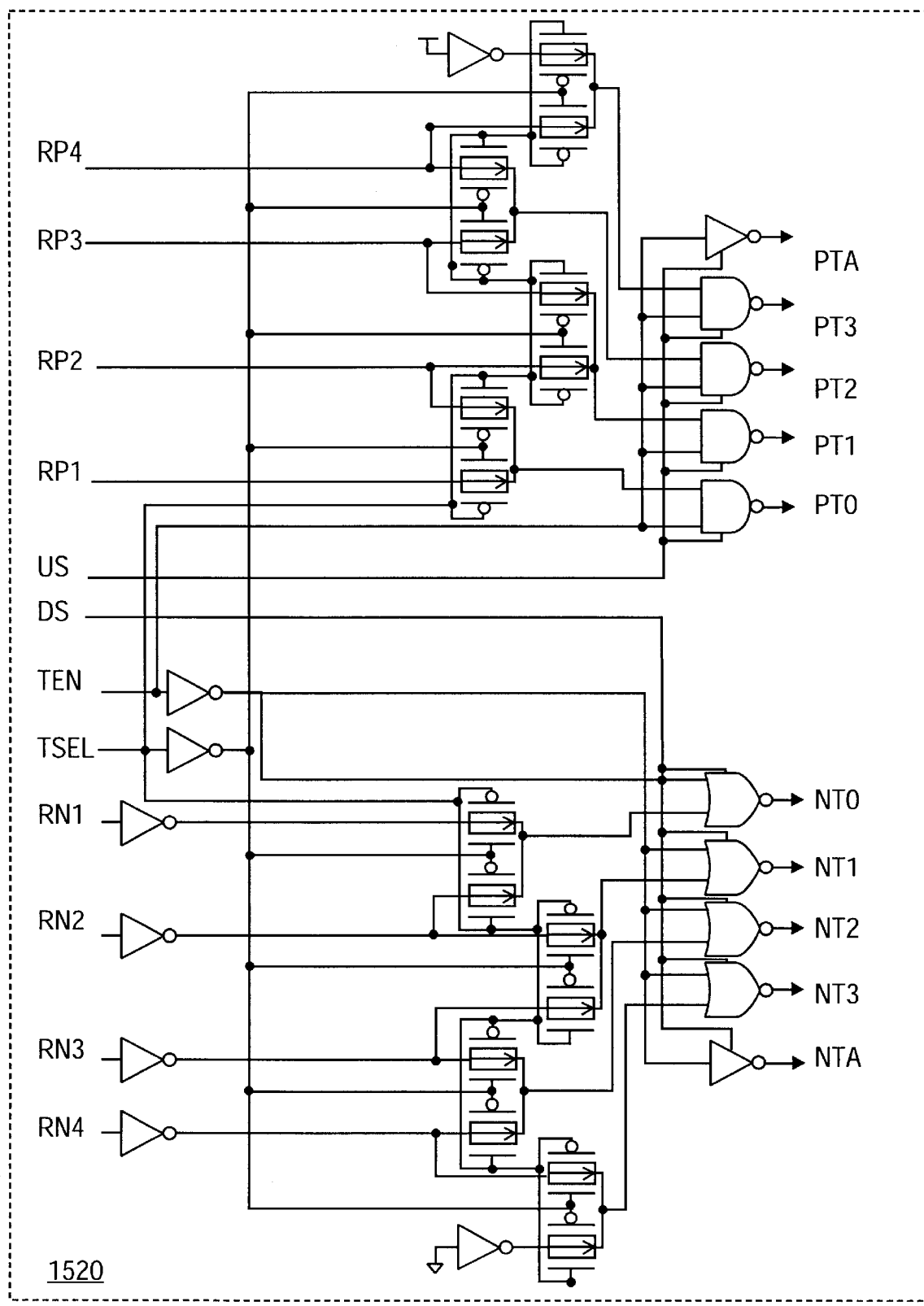
FIG. 15b details one embodiment of a compensated slew rate control circuit, 1520, for controlling terminator circuitry in a bi-directional driver/receiver device with some reuse of the slew rate control circuitry of driver compensated slew rate control, 1410.
Figure 16:
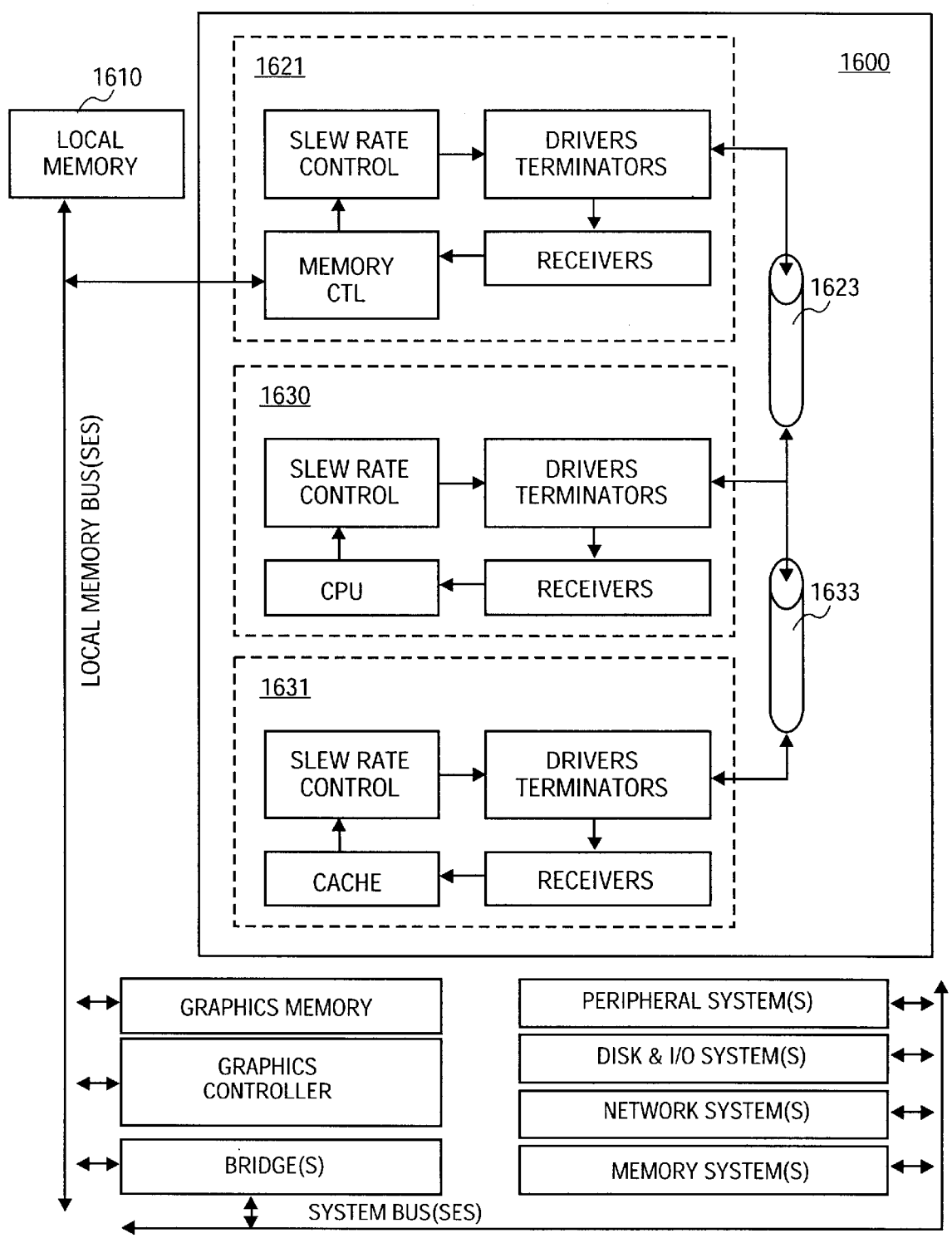
FIG. 16 shows one embodiment of a computer system comprising a plurality of components, each component having a slew rate control circuit for controlling terminator circuitry.

FIG. 15b details one embodiment of a compensated slew rate control circuit 1520 for controlling terminator circuitry 1335 in a bi-directional driver/receiver device with some reuse of compensated slew rate circuitry. The up-slew accumulation node, US, of compensated slew rate control circuit 1410 is connected with the pre-drive NAND and NOT gates instead of connecting them with a common ground. The down-slew accumulation node, DS, of the compensated slew rate control circuit 1410 is connected with the predrive NOR and NOT gates instead of connecting them with Vcc. Therefore the speed at which node, US, is pulled down through the resistance selected by SH[0-4] determines the rate at which the p-type transistors in termination circuitry 1335 are activated, and the rate at which a charge accumulates at down-slew node, DS, according to the resistance selected by low active slew adjustment selectors SL[0-4], determines the rate at which the n-type transistors in termination circuitry 1335 are activated FIG. 16 illustrates one embodiment of a computer system including a multiple components, each having a slew rate control circuit for controlling the rate at which terminator circuitry is engaged. Of course, it should be noted that is would be possible to assemble such a computer system having only one component, a central processing unit (CPU) for example, having a slew rate control circuit for controlling the engagement of terminators. Other components could include: receivers, which could always remain terminated; or drivers, which could simply be disabled without activating any termination circuitry; or numerous other components using termination techniques known in the art, which do not include slew rate controlled activation or deactivation.

FIG. 16 depicts three components, which have slew rate controlled termination: a memory controller 1621, a CPU 1630, and a cache 1631. These components as well as other components and communication structures have been illustrated by way of example and not limitation. CPU 1630, is connected with transmission line 1633 to transmit or receive signals to or from cache 1631. CPU 1630 is also connected with transmission line 1623 to transmit or receive signals to or from memory controller 1621. Memory controller 1621 is also connected with local memory 1610 and with transmission line 1633 to transmit or receive signals to or from cache 1631. Transmission lines, 1623 or 1633, could either or both be conductive lines or traces, which are part of 1600, and 1600 could be a multi-chip module, or a single die, or an assembly of components on a printed circuit board, or any other reasonable device, assembly or combination of assemblies used in the art.

Figure 17:
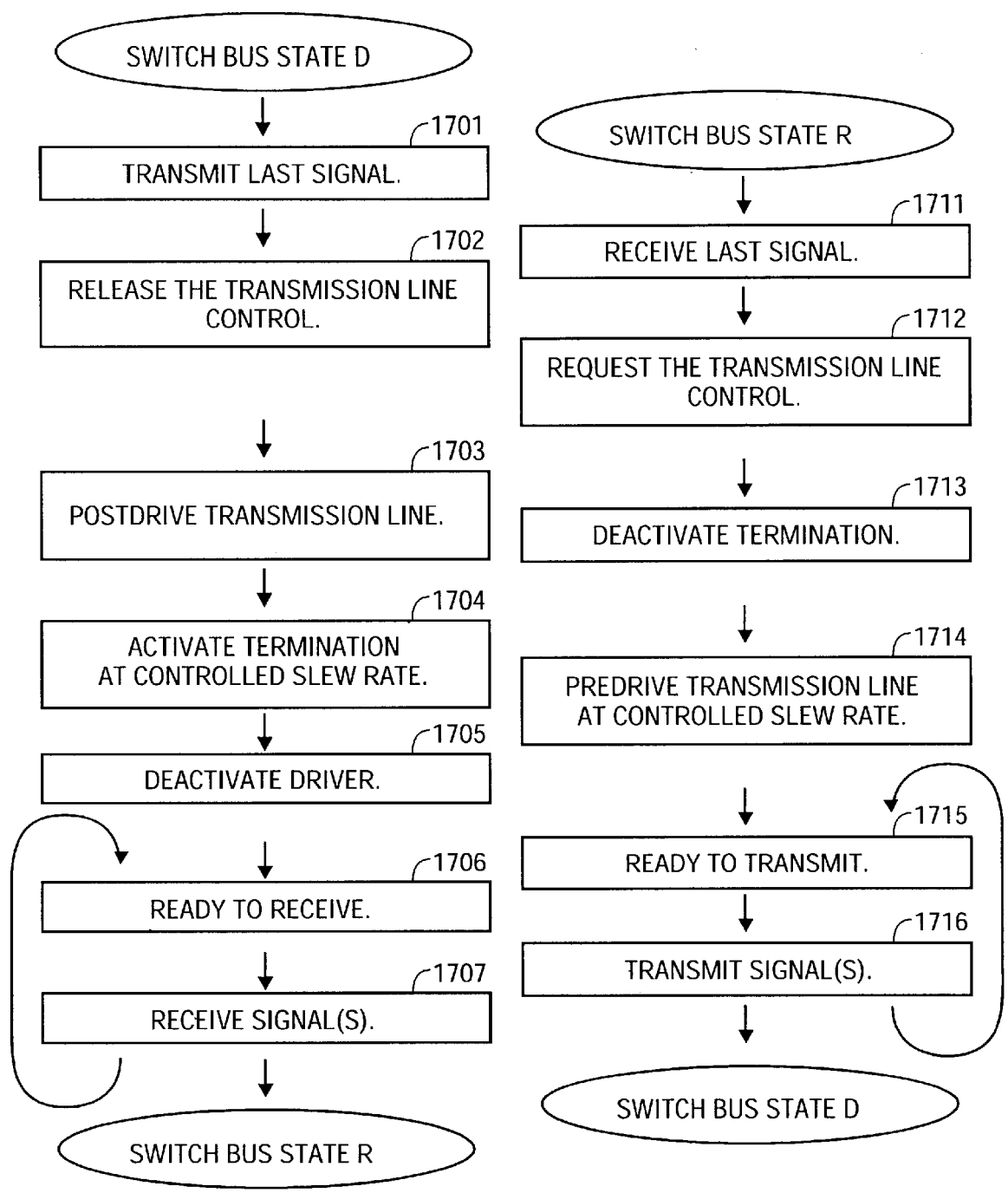
FIG. 17 shows one possible method for switching transmission direction of a bi-directional transmission line with slew rate controlled activation of line termination.

FIG. 17 shows one possible method for switching a transmission direction of a bi-directional transmission line with slew rate controlled activation of line termination. This embodiment of the method illustrates slew rate controlled activation but could also include slew rate controlled deactivation. A first driver that is prepared to transmit a final signal and to relinquish control of the transmission line or lines, would be in Switch-bus-state-D and would proceed to transmit the last signal, 1701, and release control of the transmission line, 1702. A first receiver, needing to transmit signals as a driver on the transmission line, would be in Switch-bus-state-R and would proceed to receive the last transmitted signal, 1711, and request control of the transmission line. The first driver would then proceed to post-drive the transmission line, 1703, to the same logic level as the last signal transmitted, 1701. The first receiver would proceed to deactivate termination circuits, 1713, and pre-drive the transmission line at a controlled slew rate, 1714, to the same logic level that the first driver is postdriving the transmission line, 1703. The first driver would proceed to activate its termination circuitry at a controlled slew rate, 1704, and deactivate its driver circuits, 1705. At this point, the first driver is ready to receive, 1706, and the first receiver is ready to transmit, 1715. The first receiver proceeds to transmit signals, 1716, becoming a second driver, and the first driver receives the signals transmitted, 1707, becoming a second receiver. This continues until the second driver is ready to transmit a last signal and relinquish control of the transmission line, moving to Switch-bus-state-D, or the second receiver needs to transmit signals as a driver on the transmission line, moving to Switch-bus-state-R.

Although several embodiments are specifically illustrated and described herein, it will be appreciated that modifications and variations of the present invention are covered by the above teachings and within the purview of the appended claims without departing from the spirit and intended scope of the invention. For example, CTT has been described and illustrated, but certainly slew rate control can be applied to activation of other types of termination circuitry. Slew rate control during deactivation could also be used for termination circuitry. Additionally, even though compensated control circuitry of a certain type was illustrated, other types of compensated control circuitry, predrive circuitry, or other activation or deactivation technologies could be used in conjunction with slew rate control.

What is claimed is:

1. A slew rate controlled termination circuit comprising:
   a first termination circuit coupled with a transmission line terminal, and a first voltage terminal, the first termination circuit having a first activation input and being responsive to a signal on the first activation input to conduct a current between the transmission line terminal and the first voltage terminal through a first resistance; and
   a first slew rate control circuit to supply a first signal to the first activation input of the first termination circuit to cause the first termination circuit to present a high impedance between the transmission line terminal and the first voltage terminal, said high impedance having a higher resistance than said first resistance, and the first slew rate control to supply a second signal to the first activation input to cause the first termination circuit to transition from the high impedance to the first resistance at a controlled slew rate.

2. The circuit recited in claim 1, further comprising:
   a compensated control circuit to supply a signal to the first activation input of the first termination circuit and to supply a signal to a second activation input of the first termination circuit, the first termination circuit being responsive to the signal on the second activation input to conduct a current between the transmission line terminal and the first voltage terminal through a second resistance; and
   a second slew rate control circuit to supply a third signal to the second activation input of the first termination circuit to cause the first termination circuit to present a high impedance between the transmission line terminal and the first voltage terminal, said high impedance having a higher resistance than said second resistance, and the second slew rate control to supply a fourth signal to the second activation input to cause the first termination circuit to transition from the high impedance to the second resistance at a controlled slew rate.

3. The circuit recited in claim 2, wherein:
   the first resistance and the second resistance are binary-weighted.

4. The circuit recited in claim 1, further comprising:
   a second termination circuit coupled with a transmission line terminal, and a second voltage terminal, the second termination circuit having a second activation input and being responsive to a signal on the second activation input to conduct a current between the transmission line terminal and the second voltage terminal through a second resistance; and a second slew rate control circuit to supply a third signal to the second activation input of the second termination circuit to cause the second termination circuit to present a high impedance between the transmission line terminal and the second voltage terminal, said high impedance having a higher resistance than said second resistance, and the second slew rate control circuit to supply a fourth signal to the second activation input to cause the termination circuit to transition from the high impedance to the second resistance at a controlled slew rate.

5. The circuit recited in claim 4, further comprising:

a compensated control circuit to supply signals to the first activation input and to a third activation input of the first termination circuit, and to supply signals to the second activation input and to a fourth activation input of the second termination circuit, the first termination circuit being responsive to a signal on the third activation input to conduct a current between the transmission line terminal and the first voltage terminal through a third resistance and the second termination circuit being responsive to a signal on the fourth activation input to conduct a current between the transmission line terminal and the second voltage terminal through a fourth resistance:

wherein the active resistance between the transmission line terminal and the first voltage terminal is a combination of the first resistance and third resistance selected by signals on the first activation input and the third activation input and the active resistance between the transmission line terminal and the second voltage terminal is a combination of the second resistance and fourth resistance selected by signals on the second activation input and the fourth activation input.

6. The circuit recited in claim 1, further comprising:

a driver circuit coupled with the transmission line terminal and the first voltage terminal, the driver circuit having a second activation input and being responsive to a signal on the second activation input to conduct a current between the transmission line terminal and the first voltage terminal through a second resistance; wherein the first slew rate control circuit is also to supply a third signal to the second activation input of the driver circuit to cause the driver circuit to present a high impedance between the transmission line terminal and the first voltage terminal, said high impedance having a higher resistance than said second resistance, and the first slew rate control circuit is also to supply a fourth signal to the second activation input to cause the driver circuit to transition from the high impedance to the second resistance at a controlled slew rate.

7. The circuit recited in claim 6, further comprising:

a switching device of a first impedance range connected with a second voltage terminal and with a charge accumulation node to conduct a current between the second voltage terminal and the charge accumulation node, wherein a voltage level of the charge collecting node determines the voltage level of the second signal supplied to the first activation input of the termination circuit and the voltage level of the fourth signal supplied to the second activation input of the driver circuit.

8. The circuit recited in claim 1, the first slew rate control circuit further comprising:

a charge accumulation node connected with a second voltage terminal through a second resistance to generate a controlled slew rate for the second signal supplied to the first activation input.

9. The circuit recited in claim 8, the first slew rate control circuit further comprising:

a slew rate selection input for selecting a third resistance connected with the second voltage terminal and with the charge accumulation node to generate a selected controlled slew rate for the second signal supplied to the first activation input.

10. A method comprising:

driving a last voltage level corresponding to a last signal onto a transmission line through a driver circuit;

releasing control of the transmission line;

disengaging the driver circuit; and engaging a termination circuit at a controlled slew rate by providing a slew rate controlled input voltage to the termination circuit.

11. A method comprising:

receiving a last voltage level corresponding to a last signal on a transmission line;

requesting control of the transmission line;

disengaging a termination circuit and engaging a driver circuit at a controlled slew rate to drive a same voltage level corresponding to the last signal onto the transmission line.

12. A computer software product having one or more recordable medium having executable instructions stored thereon, which when executed by a processing device, cause the processing device to generate a design for a bi-directional communication device, by:

connecting a first switching device of a first impedance range with a first voltage source and with a charge collecting node to conduct a current between the first voltage source and the charge collecting node;

connecting a second switching device with the charge collecting node and with a slew rate controlled activation input of a line termination device of a second impedance range to conduct a current between the charge collecting node and the slew rate controlled activation input;

connecting the termination device with a second voltage source and with a transmission line terminal to transition from a high impedance of the second impedance range to a lower impedance of the second impedance range at a controlled slew rate and to conduct current between the second voltage source and the transmission line terminal responsive to a signal received on its slew rate controlled activation input.

13. An apparatus comprising:

a first switching device of a first impedance range connected with a first voltage terminal and with a charge collecting node to conduct a current between the first voltage terminal and the charge collecting node;

a second switching device connected with the charge collecting node and with a slew rate controlled activation input of a line termination device of a second impedance range to conduct a current between the charge collecting node and the slew rate controlled activation input;

said line termination device connected with a second voltage terminal and with a transmission line terminal to transition from a high impedance of the second impedance range to a lower impedance of the second impedance range at a controlled slew rate and to conduct current between the second voltage terminal and the transmission line terminal responsive to a signal received on its slew rate controlled activation input.

14. A digital system comprising:

a transmission line;

a first component connected with the transmission line to receive or to transmit signals on the transmission line, the first component including a line termination circuit connected with the transmission line and a slew rate control circuit to engage or disengage line termination at a controlled slew rate by providing a slew rate controlled input voltage to the line termination circuit of the first component; and a second component to receive or to transmit signals on the transmission line, the second component including a line termination circuit connected with the transmission line and a slew rate control circuit to engage or disengage line termination at a controlled slew rate by providing a slew rate controlled input voltage to the line termination circuit of the second component.

15. An apparatus comprising:

a charge accumulation node;

slew control means for accumulating a charge at said charge accumulation node to a first voltage level at a controlled rate;

activation means for switching current flow between said charge accumulation node and a termination control input; and termination means for engaging or disengaging line termination at a controlled slew rate in response to a voltage level received on said termination control input.

16. The apparatus of claim 15 further comprising:

compensated termination control means for adjusting an impedance range of said termination means.

17. The apparatus of claim 16 further comprising:

compensated driver control means for adjusting an impedance range of a driver circuit: and means for sharing said slew control means between said compensated termination control means and said compensated driver control means.

18. A method comprising:

employing a driver circuit to charge a transmission line terminal to a last voltage level corresponding to a last transmission signal;

releasing control of the transmission line;

disengaging the driver circuit; and adjusting a termination circuit coupled to the transmission line terminal from a first impedance level to a second impedance level, differing from the first impedance level, wherein the adjusting is performed at a slew rate selected from a plurality of slew rates.

19. A method comprising:

receiving a last voltage level corresponding to a last transmission signal at a transmission line terminal;

requesting control of the transmission line;

disengaging a termination circuit; and engaging a driver circuit to charge a transmission line terminal to a same voltage level corresponding to the last transmission signal by adjusting a charge on an input to the driver circuit from a first voltage level to a second voltage level, differing from the first voltage level, wherein the adjusting is performed at a controlled slew rate.

20. A digital system comprising:

a transmission line;

a first component connected with the transmission line to receive or to transmit signals on the transmission line, the first component including a line termination circuit connected with the transmission line and operatively coupled with a slew rate control circuit to engage line termination at a controlled slew rate; and a second component to receive a last voltage level corresponding to a last transmission signal on the transmission line, the second component including a line termination circuit connected with the transmission line and operatively coupled with a slew rate control circuit to disengage line termination and to engage a driver circuit to charge the transmission line to a same voltage level corresponding to the last transmission signal by adjusting a charge on an input to the driver circuit from a first voltage level to a second voltage level, differing from the first voltage level, wherein the adjusting is performed at a controlled slew rate.

21. A method for making a communication device comprising:

connecting a first switching device of a first impedance range with a first voltage source and with a charge collecting node to conduct a current between the first voltage source and the charge collecting node;

connecting a second switching device with the charge collecting node and with a slew rate controlled activation input of a line termination device of a second impedance range to conduct a current between the charge collecting node and the slew rate controlled activation input; and connecting the termination device with a second voltage source and with a transmission line terminal to transition from a high impedance of the second impedance range to a lower impedance of the second impedance range at a controlled slew rate and to conduct current between the second voltage source and the transmission line terminal responsive to a signal received on its slew rate controlled activation input.

22. An apparatus comprising:

a termination circuit of a first impedance range having an activation input;

a slew rate control circuit to supply a signal to the activation input at a selected rate to cause the termination circuit to transition from a high impedance of the first impedance range to a low impedance of the first impedance range at a controlled slew rate.

* * * * *